United States Patent [19]
Watanabe

[11] Patent Number: 5,428,573
[45] Date of Patent: Jun. 27, 1995

[54] INTEGRATED CIRCUIT DEVICE
[75] Inventor: Yuji Watanabe, Kawasaki, Japan
[73] Assignee: Kabushiki Kaisha Toshiba, Kawasaki, Japan
[21] Appl. No.: 113,072
[22] Filed: Aug. 30, 1993
[30] Foreign Application Priority Data
Aug. 28, 1992 [JP] Japan .................. 4-230587
[51] Int. Cl.$^6$ .............................................. G11C 7/00
[52] U.S. Cl. .................. 365/200; 365/230.01; 365/230.06; 365/238.5; 371/10.3
[58] Field of Search ............. 365/200, 230.01, 230.06, 365/238.5; 371/10.1, 10.2, 10.3

[56] References Cited
U.S. PATENT DOCUMENTS 5,134,583 7/1992 Matsuo et al. .................. 35/189.05
5,255,228 10/1993 Hatta et al. ..................... 365/200

*Primary Examiner*—Joseph A. Popek
*Assistant Examiner*—Huan Hoang
*Attorney, Agent, or Firm*—Foley & Lardner

[57] ABSTRACT

An integrated circuit device comprises a memory cell array, a core section, a decoder section, and an input and output section. The memory cell array is composed of a plurality of memory cells and data are transmitted and received between the memory cells and corresponding column lines. The core section has a plurality of data lines. Data is transmitted and received between the data lines and the column lines. Any given number of the column select lines are activated simultaneously for conduction between the column line and the data line. The decoder section includes a plurality of column decoders for activating any given number of the column select lines simultaneously. The input and output section transmits and receives data between the data lines and the outside. The basic operations of a SDRAM (synchronous DRAM) such as serial access and wrap access can be realized simply.

42 Claims, 17 Drawing Sheets

| A3 | A2 | A1 | | |
|---|---|---|---|---|
| 0 | 0 | 0 | CSL 0 / CSL 1 | CSLA 0 |
| | | 1 | CSL 2 / CSL 3 | CSLB 0 |
| | 1 | 0 | CSL 4 / CSL 5 | CSLC 0 |
| | | 1 | CSL 6 / CSL 7 | CSLD 0 |
| 1 | 0 | 0 | CSL 0 / CSL 1 | CSLE 0 |
| | | 1 | CSL 2 / CSL 3 | CSLF 0 |
| | 1 | 0 | CSL 4 / CSL 5 | CSLG 0 |
| | | 1 | CSL 6 / CSL 7 | CSLH 0 |

FIG. 1 (A)

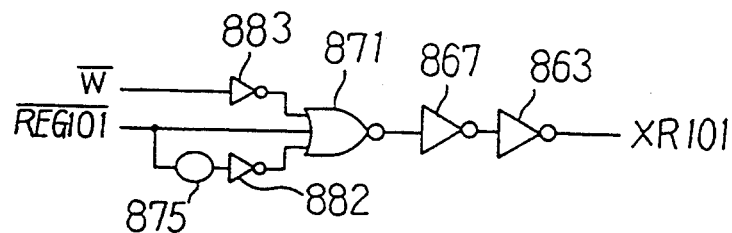
F I G. 13 (A)
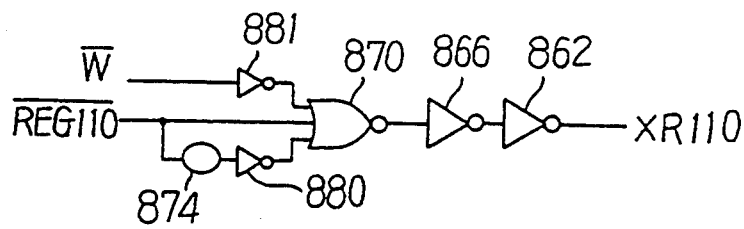
F I G. 13 (B)
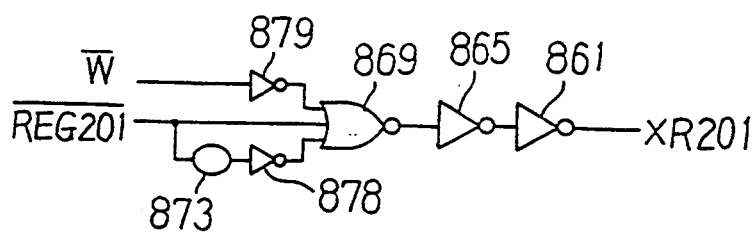
F I G. 13 (C)
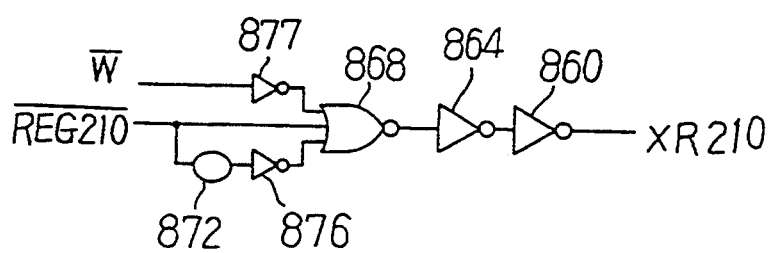
F I G. 13 (D)

INTEGRATED CIRCUIT DEVICE

FIELD OF THE INVENTION

The present invention relates to an integrated circuit device, and more specifically to an integrated circuit device suitable for replacing column select lines with spare column select lines effectively in a large-scale semiconductor integrated circuit memory device.

BACKGROUND OF THE INVENTION

In the conventional integrated circuit memory device, only the column select lines connected physically have been activated. Further, the column select lines have been replaced with spare column select lines in unit of the column select lines once activated, in order to relieve defective cells arranged in the column.

In the case of a synchronous random access memory (referred to as SDRAM, hereinafter), when only one physically connected column select line is activated for serial access, the following problems arise: in the case where serial access is made when the endmost address of the column select line becomes a tap address, the column select line must be activated at the minimum cycle. In this case, however, there exists a problem in that a large load is applied to the circuit system and thus a high speed access cannot be realized. In addition, when the select lines are replaced with the spare select lines in unit of the select lines activated simultaneously, since the spare column lines are used sometime wastefully, there arises a problem in that the production yield is deteriorated.

SUMMARY OF THE INVENTION

With these problems in mind, therefore, the object of the present invention is to provide an integrated circuit device provided with a column system circuit suitable for realizing various operation required for the SDRAM such as serial access, wrap access, etc.

To achieve the above-mentioned object, the present invention provides an integrated circuit device, comprising: a memory cell array (MCA) composed of a plurality of memory cells each for storing data respectively and provided with a normal column portion (NCP) used under normal conditions, data being transmitted and received between the memory cells and corresponding column lines (CL); a core section (5) having a plurality of data lines (DQ0 to DQ3), each of the column lines (CL) being connected to any of the data lines through a switch (SW1), data being transmitted and received between the data line (DQ0 to DQ3) and the column line (CL) connected to each other through the turned on switch (SW1); a decoder section (31, 32, ...) connected to the switches (SW1) of said core section (5) through a plurality of column select lines (CSLA0, CSLB0, ...), any given number of the column select lines (CSLA0 to CSLB0) being activated simultaneously in response to column select drive signals (/CDRVA to /CDRVH), each activated column select line (CSLA0 to CSLB0, ...) turning on the switch (SW1) connected thereto for conduction between the column line (CL) and the data line (DQ0 to DQ3), said decoder section including a plurality of column decoders (31, 32) selected by partial decoders (41, 42, ...) each operative in response to partial decode signals (YA to YC), the selected decoders (31, 32, ...) decoding the column select drive signals (/CDRVA to /CDRVH) to activate any given number of the column select lines (CSLA0 to CSLB0) simultaneously; and input and output means (2, RWD, QACT, 1) for transmitting and receiving data between the data lines (DQ0 to DQ3) and the-outside.

Further, the present invention provides a method of activating column select lines in an integrated circuit device, comprising the steps of: operating partial decoders (41, 42, ...) on the basis of partial decode signals (YA to YC) to select any given column decoders (31, 32, ...); decoding column select drive signals (/CDRVA to /CDRVH) by the selected column decoders to select any given number of column select lines (CSLA0, CSLB0, ...); and turning on switches (SW1) for connecting and disconnecting column lines (CL) of a memory cell array (MCA) to and from data lines (DQ0 to DQ3) connected to input and output means (2, RWD0, RWD1, 1), by the respective selected column select lines (CSLA0, CSLB0, ...).

A plurality of column select lines connected to a single core section are activated simultaneously by the decoder section. Further, when the normal column select lines are replaced with spare column lines, the column select lines whose number is smaller than that of the column select lines activated simultaneously are replaced with the spare column select lines.

BRIEF DESCRIPTION OF THE DRAWINGS

FIG. 1(A) is an address table corresponding to the outputs of the column decoders 31 and 32 shown in FIG. 1;

FIGS. 13(A) to 13(D) are circuit diagrams showing configurations of the circuits for generating control signals to the read data registers in the circuit device shown in FIG. 12(A);

DETAILED DESCRIPTION OF THE PREFERRED EMBODIMENTS

The embodiments of the present invention will be described hereinbelow with reference to the attached drawings.

Figure 1:
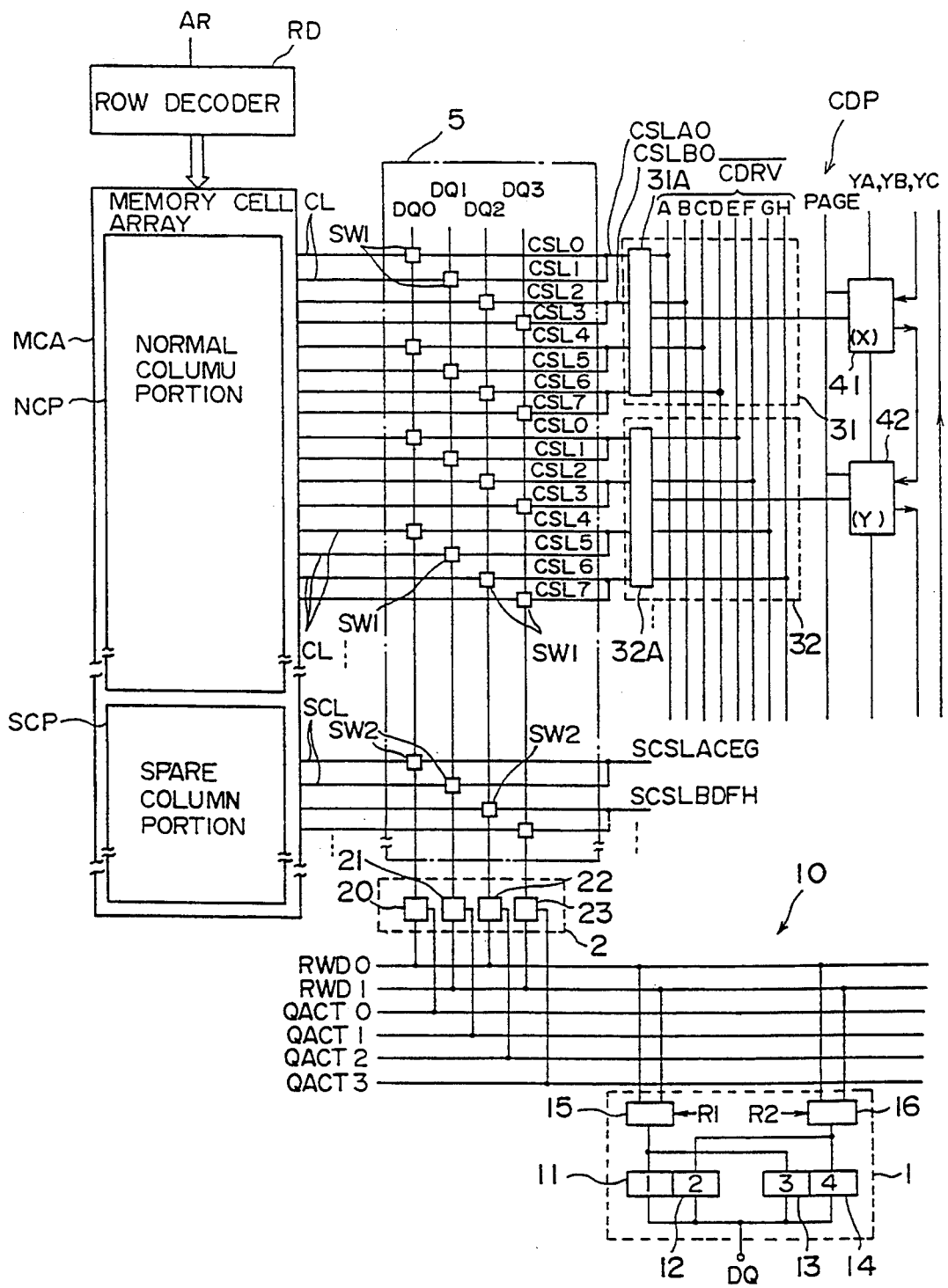
FIG. 1 is a circuit diagram :showing a first embodiment of the integrated circuit device according to the present invention.

FIG. 1 shows a first embodiment of the integrated circuit device according to the present invention.

Figure 4:
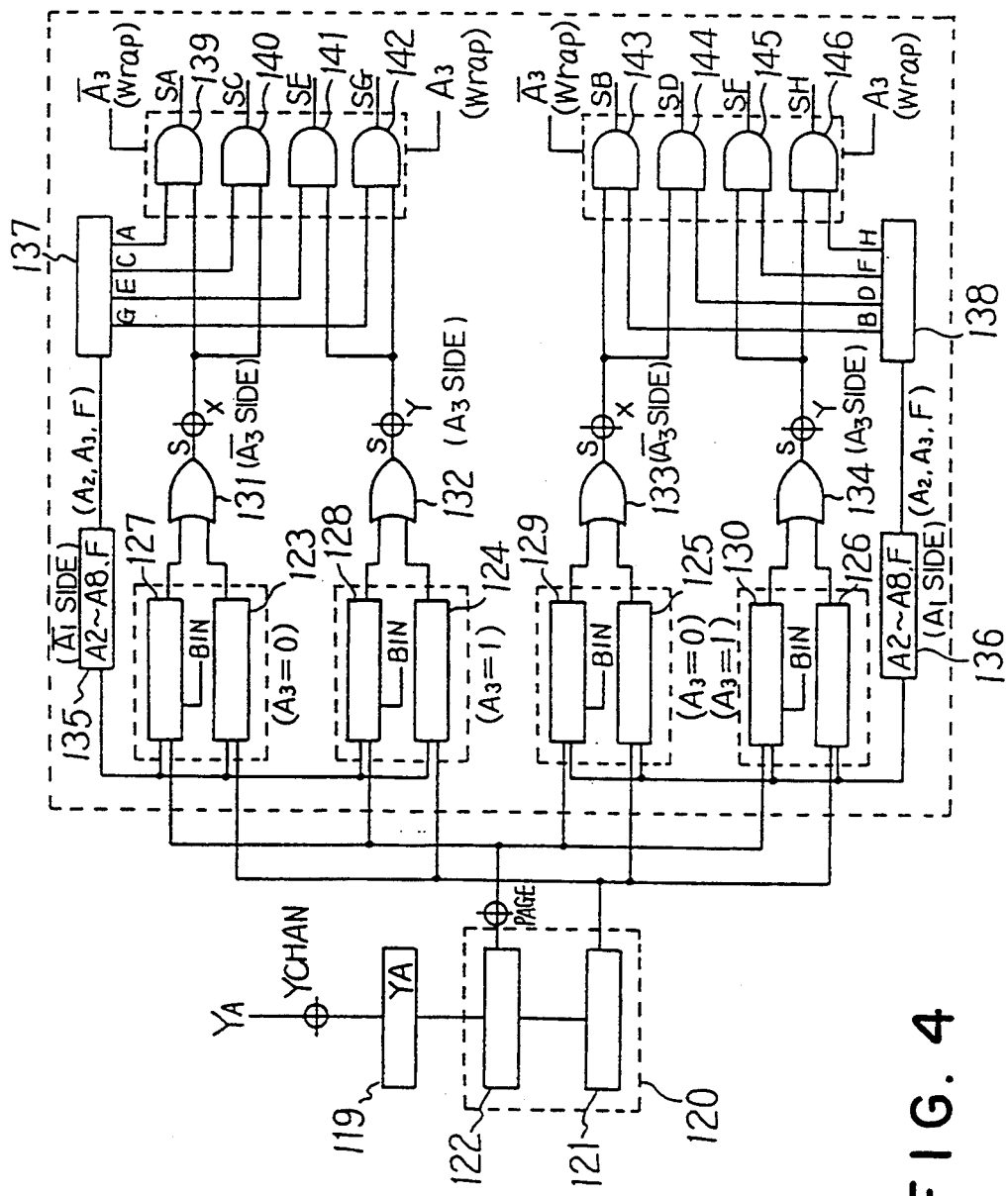
FIG. 4 is a circuit diagram showing a configuration of the spare/normal discriminating circuit in the circuit device shown in FIG. 1.

In FIG. 1, a memory cell array MCA is composed of a plurality of memory cells and provided with a normal column portion NCP and a spare column portion SCP. Row addresses of the memory cell array MCA are selected by the output of a row decoder RD to which row address signals AR are inputted. Data selected from or to the memory cells are transmitted or received between column lines CL and/or spare column lines SCL. The column lines CL and the spare column lines SCL are connected to data lines DQ0 to DQ3 of a core section 5 through switches SW1 and SW2, respectively. Whenever the switches SW1 and SW2 are turned on or off, the column lines CL and the spare column lines SCL are connected to or disconnected from the data lines DQ0 to DQ3, respectively. The switches SW1 and SW2 are turned on or off by a column decoder portion CDP. In more detail, partial decode signals YA to YC are applied to partial decoders 41, 42, . . . In response to the partial decode signals YA to YC, the partial decoders 41, 42, . . . are activated to select one of the column decoders 31, 32, . . . The selected column decoder decodes the inputted column select drive signals /CDRVA to /CDRVH to activate two column select lines CSLA0, CSLB0, . . . For example, when the two column select lines CSLA0 and CSLB0 are activated, four lines CSL0 to CSL3 are activated, so that the switches connected to these activated lines are turned on. Further, a page signal PAGE is applied to the partial decoders 41, 42, . . . In this case, it is also possible to select a decoder other than the decoder selected by the partial decode signals YA to YC, that is, irrespective of the partial decode signals YA to YC.

Where the column select lines CSLA0, CSLB0, . . . are selected, spare/normal discrimination is executed by the use of a spare/normal discriminating circuit as shown in FIG. 4. When the spare is discriminated, one or two column select lines discriminated as being spare of the two selected column select lines CSLA0, CSLB0, . . . are replaced with spare select lines SCSL ACEG, SCSL BDFH, . . .

On the other hand, the data lines DQ0 to DQ3 are connected to data input and output means 10. Data can be transmitted and received between the data lines DQ0 to DQ3 and the input and output means 10. The input and output means 10 comprises a data buffer 2 including buffer sections 20 to 23 connected to the data lines DQ0 to DQ3, respectively. These buffer sections 20 to 23 are activated by data activating lines QACT0 to QACT3, respectively. Data are transmitted and received between the activated buffer sections 20 to 23 and read/write data lines RWD0 and RWD1. These data lines RWD0 and RWD1 are connected to register sections 11 to 14 via scramblers 15 and 16 of a data register 1.

Further, the outputs of the column decoders 31 and 32 shown in FIG. 1 correspond to the addresses A1, A2 and A3 as shown in FIG. 1(A), respectively.

The operation of the circuit device configured as shown in FIG. 1 will be described hereinbelow with reference to Tables 1 to 5. Tables 1 to 5 list the column system activation sequences indicative of how 2 or 3 significant bits of the address bits are selected in the wrap access mode (referred to as W mode, hereinafter) and the interleave access mode (referred to as I mode, hereinafter) of a 16-M bit SDRAM. Table 1 lists the column system activation sequence in the page wrap mode; Table 2 lists the column system activation sequence in the 8-wrap mode; Table 3 lists 8 lists the column system activation sequence in the 8-interleave mode; Table 4 lists the column system activation sequence in the 4-wrap mode; and Table 5 lists the column system activation sequence in the 4-interleave mode, respectively. In these Tables, the page in the page wrap mode, 8 in the 8-wrap mode, 8 in the 8-interleave mode, 4 in the 4-wrap mode, and 4 in the 4-interleave mode all correspond to the number of data to be accessed in sequence, respectively. In the case of the page wrap mode, data on the corresponding page length can be accessed in sequence beginning from the tap address in series. Further, the respective Tables list the address sequences of when the tap address is from "0" to "7", the sequence of the column select drive lines /CDRV, the activation sequence of the data lines DQ0 to DQ3, and the scramble sequences of the scramblers 15 and 16 of the data register 1. In the above-mentioned sequence, two of the A, B, C, D, E, F, G and H lines of the column select drive lines /CDRV are selectively activated. For instance, AB indicates that the A and B lines of the column select drive lines /CDRV are both activated selectively. Further, two of the data lines DQ0 to DQ3 are also selectively activated. Further, 01 indicates that the data lines DQ0 and DQ1 are both activated. For instance, "0" indicates that the data lines DQ0 and DQ1 are both activated. Further, "01" or "10" is allocated to the data register 1 according to the status A0 of the tap address.

Figure 3A:
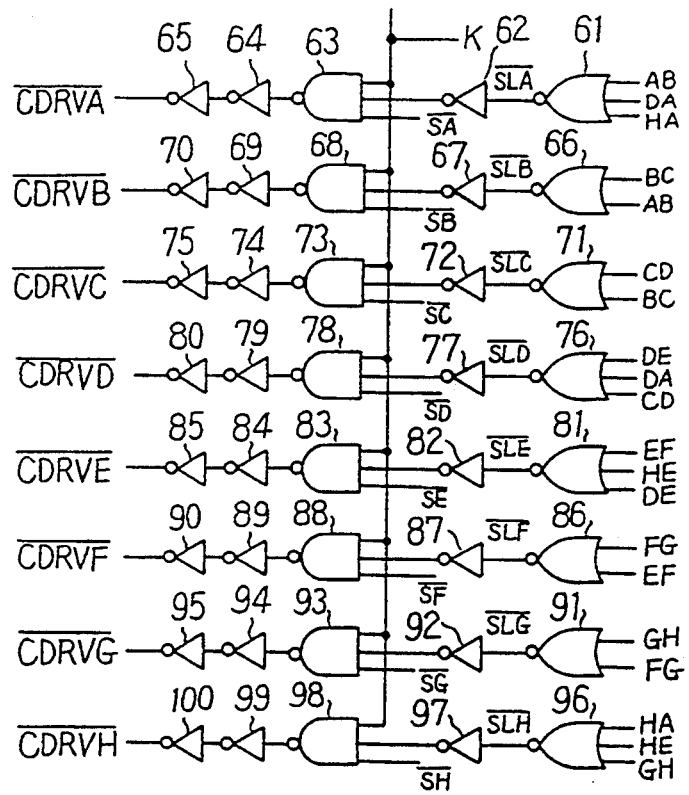
FIG. 3(A), 3(B), 3(C) and 3(D) are circuit diagrams showing configurations of circuits for generating signals applied to the column select drive lines and the spare column select lines in the circuit device shown in FIG. 1.
Figure 3B:
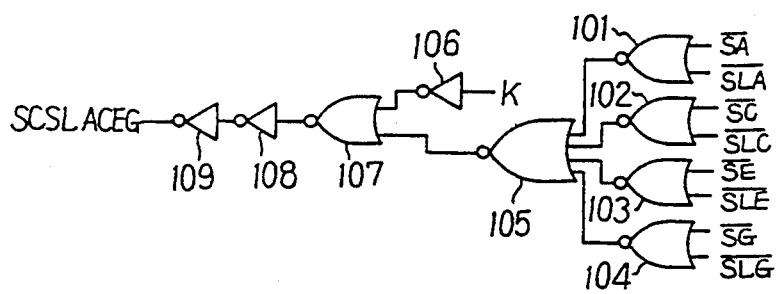
Figure 3C:
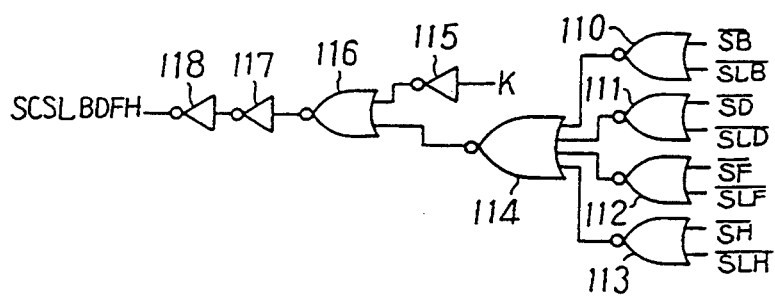
Figure 3D:
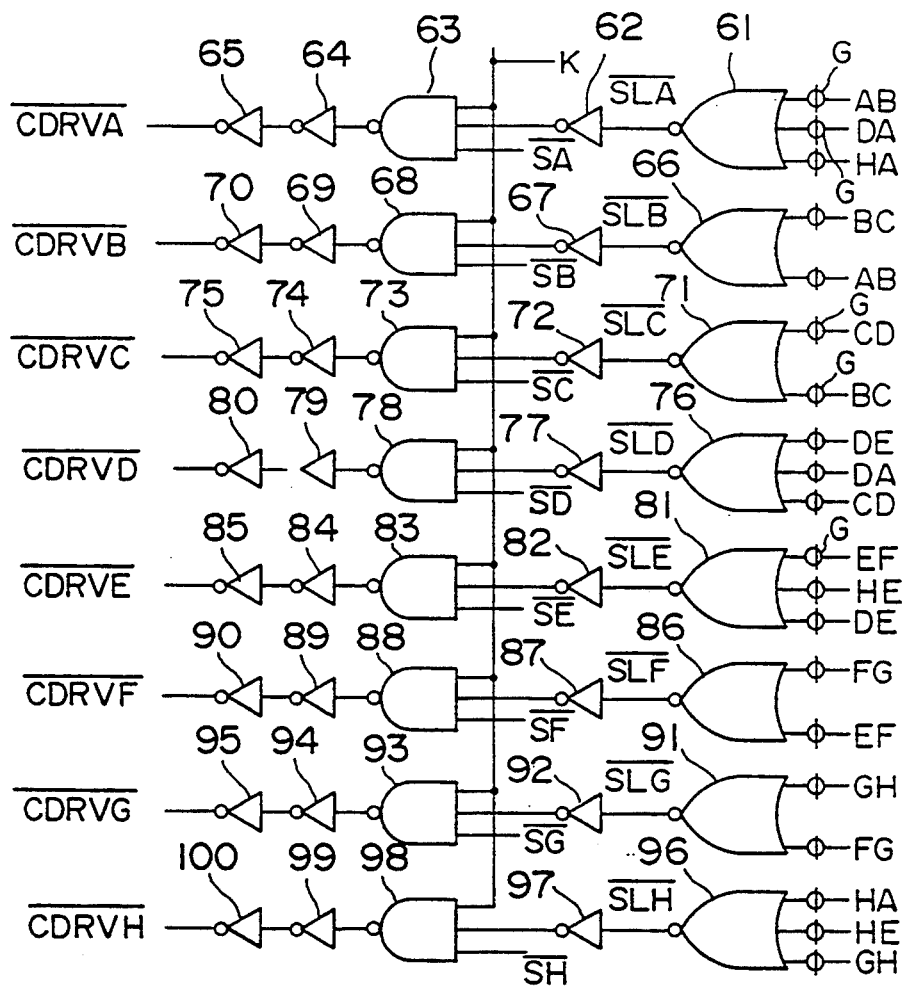

As described above, when two of the column select drive lines /CDRVA to /CDRVH are activated, two of the column select lines CSLA0, CSLB0, . . . are activated. In general, when n-units of the column select drive lines /CDRVA to /CDRVH are activated, n-units of the column select lines CSLA0, CSLB0, . . . are activated. FIG. 3(A) shows a circuit for generating the column select drive lines, which is required when n=2. Further, FIG. 3(D) shows a circuit for generating the column select drive lines, which is required when n=1. In FIG. 3(D), the input signals (e.g., A and B) are inputted to the respective NOR circuits (e.g., 61) via gates G, so that it is possible to obtain the condition of n=1 by supplying or not supplying the respective input signals to the NOR circuits.

Each of the partial decoders 41 and 42 selects one of the column decoders 31 and 32 on the basis of a combination of partial decode signals YA, YB and YC. When the A, B, C, D, E, F, G and H lines of the column select drive lines /CDRV inputted to the selected column decoder 31 or 32 are activated, the corresponding column select lines CSL0 to CSL7 are activated. As a result, four data lines DQ0 to DQ3 are read out of the core section 5. The data buffer 2 selects two of the four data lines via. the buffer sections 20 to 23 driven by the data activation lines QACT0 to QACT3 to connect the selected data lines to the read and write data lines RWD0 and RWD1. The data register 1 reads data on the read and write data lines RWD0 and RWD1 alternately to a pair of the register sections 11 and 12 and to a pair of the register sections 13 and 14 through the scramblers 15 and 16, respectively, and further outputs the read data to the data line DQ. Further, in this case, the data are read from the read and write data line RWD0 or the read and write data line RWD1 on the basis of the tap address.

Further, when the page is selected, the page signal PAGE is activated. In response to this signal, the column decoder 31 or 32 selected by the tap address and incremented by the partial decode signals YA, YB and YC is selected. Therefore, in response to change in the partial decode signals YA, YB and YC, the column decoders 3n can be selected beginning from a pair of (3n+1, 3n +2) in the order of (3n+2, 3n+3), (3n+3, 3n+4), . . .

Figure 2:
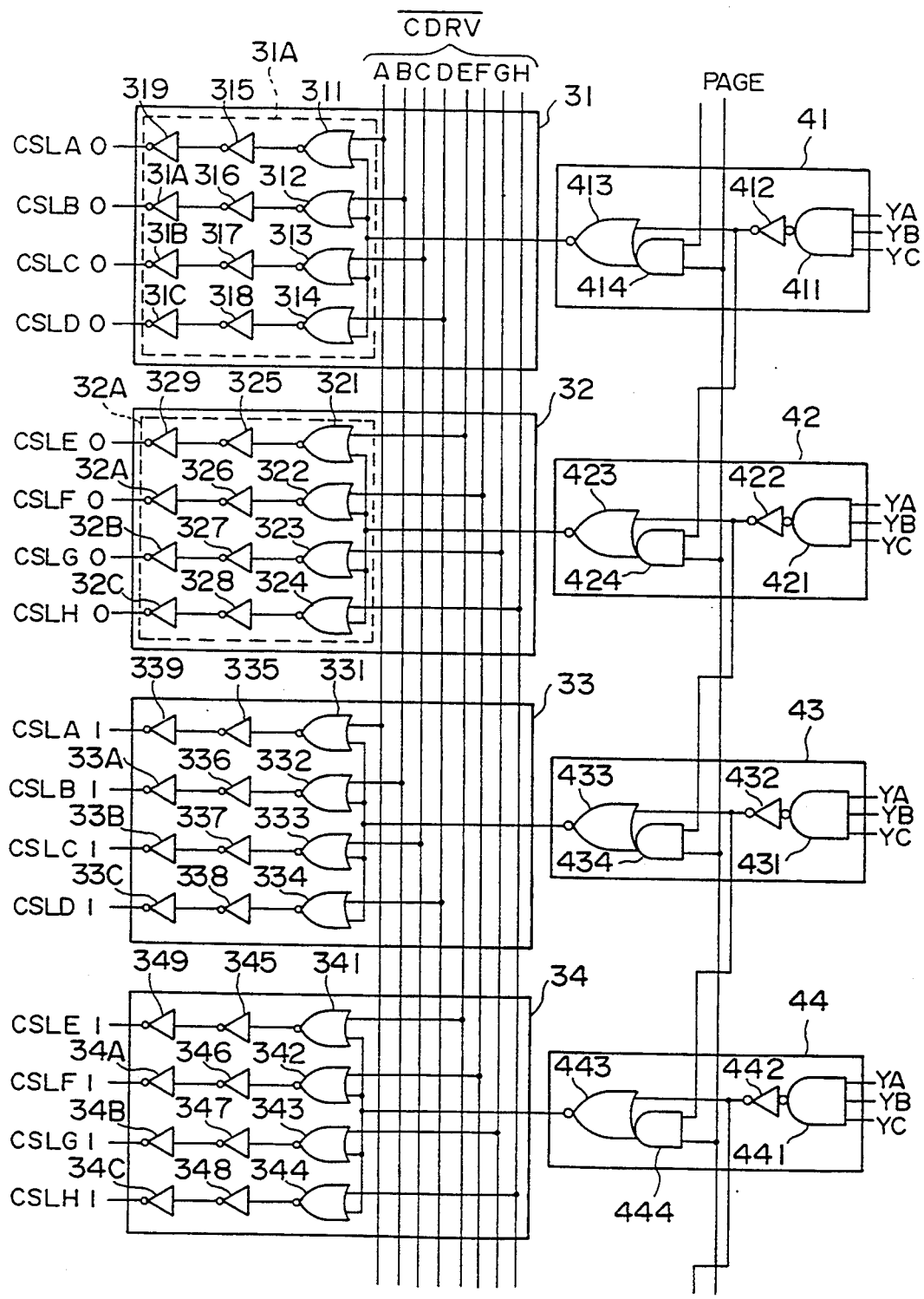
FIG. 2 is a circuit diagram showing a practical configuration of the column decoder in the circuit device shown in FIG. 1.

FIG. 2 shows a practical circuit .configurations of the column decoders 31, 32, 33 and 34. In FIG. 2, the partial decoder 41 is composed of a NAND circuit 411 to which the partial decode signals YA, YB and YC are inputted; an inverter 412 for inverting the output of the NAND circuit 411; a NOR circuit 413 to which the output of the inverter 412 is inputted; and an NAND circuit 414 connected to the input of the NOR circuit 413. Further, the page signal PAGE and the output of another preceding inverter 402 (not shown) of another partial decoder 40 (not shown) are inputted to this NAND circuit 414.

The partial decoder 42 is composed of a NAND circuit 421 to which the partial decode signals YA, YB and YC are inputted; an inverter 422 for inverting the output of the NAND circuit 421; a NOR circuit 423 to which the output of the inverter 422 is inputted; and an NAND circuit 424 connected to the input of the NOR circuit 423. Further, the page signal PAGE and the output of another preceding inverter 412 of the preceding partial. decoder 41 are inputted to this NAND circuit 424.

The partial decoder 43 is composed of a NAND circuit 431 to which the partial decode signals YA, YB and YC are inputted; an inverter 432 for inverting the output of the NAND circuit 431; a NOR circuit 433 to which the output of the inverter 432 is inputted; and an NAND circuit 434 connected to the input of the NOR circuit 433. Further, the page signal. PAGE and the output of the preceding inverter 422 of the preceding partial decoder 42 are inputted to this NAND circuit 434.

The partial decoder 44 is composed of a NAND circuit 441 to which the partial decode signals YA, YB and YC are inputted; an inverter 442 for inverting the output of the NAND circuit 441; a NOR circuit 443 to which the output of the inverter 442 is inputted; and an NAND circuit 444 connected to the input of the NOR circuit 443. Further, the page signal PAGE and the output of the preceding inverter 432 of the preceding partial decoder 43 are inputted to this NAND circuit 444.

On the other hand, the column decoder 31 is composed of a NOR circuit 311 to which the output of the line A of the column select drive lines /CDRV and the output of the partial decoder 41 are inputted; a NOR circuit 312 to which the output of the line B of the column select drive lines /CDRV and the output of the partial decoder 41 are inputted; a NOR circuit 313 to which the output of the line C of the column select drive lines /CDRV and the output of the partial decoder 41 are inputted; a NOR circuit 314 to which the output of the line D of the column select drive lines /CDRV and the output of the partial decoder 41 are inputted; inverters 315, 316, 317 and 318 for inverting the outputs of the NOR circuits 311, 312, 313 and 314, respectively; and inverters 319, 31A, 31B and 31C for inverting the outputs of the inverters 315, 316, 317 and 318, respectively and outputting the inverted outputs as the column select signals CSL A0, CSL B0, CSL C0 and CSL D0, respectively.

Further, the column decoder 32 is composed of a NOR circuit 321 to which the output of the line E of the column select drive lines /CDRV and the output of the partial decoder 42 are inputted; a NOR circuit 322 to which the output of the line F of the column select drive lines /CDRV and the output of the partial decoder 42 are inputted; a NOR circuit 323 to which the output of the line G of the column select drive lines /CDRV and the output of the partial decoder 42 are inputted; a NOR circuit 324 to which the output of the line H of the column select drive lines /CDRV and the output of the partial decoder 42 are inputted; inverters 325, 326, 327 and 328 for inverting the outputs of the NOR circuits 321, 322, 323 and 324, respectively; and inverters 329, 32A, 32B and 32C for inverting the outputs of the inverters 325, 326, 327 and 328, respectively and outputting the inverted outputs as the column select signals CSL E0, CSL F0, CSL G0 and CSL H0, respectively.

On the other hand, the column decoder 33 is composed of a NOR circuit 331 to which the output of the line A of the column select drive lines /CDRV and the output of the partial decoder 43 are inputted; a NOR circuit 332 to which the output of the line B of the column select drive lines /CDRV and the output of the partial decoder 43 are inputted; a NOR circuit 333 to which the output of the line C of the column select drive lines /CDRV and the output of the partial decoder 43 are inputted; a NOR circuit 334 to which the output of the line D of the column select drive lines /CDRV and the output of the partial decoder 43 are inputted; inverters 335, 336, 337 and 338 for inverting the outputs of the NOR circuits 331, 332, 333 and 334, respectively; and inverters 339, 33A, 33B and 33C for inverting the outputs of the inverters 335, 336, 337 and 338, respectively and outputting the inverted outputs as the column select signals CSL A1, CSL B1, CSL C1 and CSL D1, respectively.

Further, the column decoder 34 is composed of a NOR circuit 341 to which the output of the line E of the column select drive lines /CDRV and the output of the partial decoder 44 are inputted; a NOR circuit 342 to which the output of the line F of the column select drive lines /CDRV and the output of the partial decoder 44 are inputted; a NOR circuit 343 to which the output of the line G of the column select drive lines /CDRV and the output of the partial decoder 44 are inputted; a NOR circuit 344 to which the output of the line H of the column select drive lines /CDRV and the output of the partial decoder 44 are inputted; inverters 345, 346, 347 and 348 for inverting the outputs of the NOR circuits 341, 342, 343 and 344, respectively; and inverters 349, 34A, 34B and 34C for inverting the outputs of the inverters 345, 346, 347 and 348, respectively and outputting the inverted outputs as the column select signals CSL E1, CSL F1, CSL G1 and CSL H1, respectively.

FIG. 3A shows a circuit configuration for generating the respective line signals A, B, C, D, E, F G and H of the column select drive lines/CDRV; FIGS. 3(B) and 3(C) show circuit configurations for generating the spare column select line signals SCSL ACEG and SCSL BDFH, respectively. In FIG. 3(A), a NOR circuit 61 to which signals AB, DA and HA are inputted outputs a select signal /SLA. The select signal/SLA is inverted by an inverter 62 and then inputted to a NAND circuit 63 to which a reference signal K and a signal /SA are inputted. The output of the NAND 63 is inverted by an inverter 64, and further inverted by another inverter 65 to output the column select drive signal /CDRV A.

Further, a NOR circuit 66 to which signals BC and AB are inputted outputs a select signal /SLB. The select signal /SLB is inverted by an inverter 67 and then inputted to a NAND circuit 68 to which the reference signal K and a signal /SB are inputted. The output of the NAND circuit 68 is inverted by an inverter 69, and further inverted by another inverter 70 to output the column select drive signal /CDRV B.

Further, a NOR circuit 71 to which signals CD and BC are inputted outputs a select signal /SLC. The select signal /SLC is inverted by an inverter 72 and then inputted to a NAND circuit 73 to which the reference signal K and a signal /SC are inputted. The output of the NAND 73 is inverted by an inverter 74, and further inverted by another inverter 75 to output the column select drive signal /CDRV C.

Further, a NOR circuit 76 to which signals DE, DA and CD are inputted outputs a select signal /SLD. The select signal /SLD is inverted by an inverter 77 and then inputted to a NAND circuit 78 to which the reference signal K and a signal /SD are inputted. The output of the NAND circuit 78 is inverted by an inverter 79, and further inverted by another inverter 80 to output the column select drive signal /CDRV D.

Further, a NOR circuit 81 to which signals EF, HE and DE are inputted outputs a select signal /SLE. The select signal /SLE is inverted by an inverter 82 and then inputted to a NAND circuit 83 to which the reference signal K and a signal /SE are inputted. The output of the NAND circuit 83 is inverted by an inverter 84, and further inverted by another inverter 85 to output the column select drive signal /CDRV E.

Further, a NOR circuit 86 to which signals FG and EF are inputted outputs a select signal /SLF. The select signal /SLF is, inverted by an inverter 87 and then inputted to a NAND circuit 88 to which the reference signal K and a signal /SF are inputted. The output of the NAND circuit 88 is inverted by an inverter 89, and further inverted by another inverter 90 to output the column select drive signal /CDRV F.

Further, a NOR circuit 91 to which signals GH and FG are inputted outputs a select signal /SLG. The select signal /SLG is inverted by an inverter 92 and then inputted to a NAND circuit 93 to which the reference signal K and a signal /SG are inputted. The output of the NAND circuit 93 is inverted by an inverter 94, and further inverted by another inverter 95 to output the column select drive signal /CDRV G.

Further, a NOR circuit 96 to which signals HE, HA and GH are inputted outputs a select signal /SLH. The select signal /SLH is inverted by an inverter 97 and then inputted to a NAND circuit 98 to which the reference signal K and a signal /SH are inputted. The output of the NAND circuit 98 is inverted by an inverter 99, and further inverted by another inverter 100 to output the column select drive signal /CDRV H.

On the other hand, a NOR circuit 101 to which signals /SA and /SLA are inputted outputs a NORed signal to another NOR circuit 105. A NOR circuit 102 to which signals /SC and /SLC are inputted outputs a NORed signal to the NOR circuit 105. A NOR circuit 103 to which signals /SE and /SLE are inputted outputs a NORed signal to the NOR circuit 105. A NOR circuit 104 to which signals/SG and/SLG are inputted outputs a NORed signal to the NOR circuit 105. The output of the NOR circuit 105 is inputted to a NOR circuit 107 to which the reference signal K is inputted via an inverter 106. The output of the NOR circuit 107 is inverted by an inverter 108 and further inverted by another inverter 109 to generate the spare column select line SCSL ACEG.

Further, a NOR circuit 110 to which signals /SB and /SLB are inputted outputs a NORed signal to another NOR circuit 114. A NOR circuit 111 to which signals /SD and /SLD are inputted outputs a NORed signal to the NOR circuit 114. A NOR circuit 112 to which signals /SF and /SLF are inputted outputs a NORed signal to the NOR circuit 114. A NOR circuit 113 to which signals /SH and /SLH are inputted outputs a NORed signal to the NOR circuit 114. The output of the NOR circuit 114 is inputted to a NOR circuit 116 to which the reference signal K is inputted via an inverter 115. The output of the NOR circuit, 116 is inverted by an inverter 117 and further inverted by another inverter 118 to generate the spare column select line SCSL BDFH.

FIG. 4 shows a circuit configuration of a spare/normal discriminating circuit. In FIG. 4, the partial decode signal YA is inputted to a counter 120 via a Y-channel YCHAN and a buffer circuit 119. The counter 120 is composed of an output preparation circuit 121 and an output circuit 122. The output of the output preparation circuit 121 is checked with a page signal PAGE and further inputted to comparators 123, 124, 125 and 126. On the other hand, the output of the output circuit 122 is inputted to comparators 127, 128, 129 and 130. Here, the comparators 123 and 127 correspond to an address A3=0; the comparators 124 and 128 correspond to an address A3=1; the comparators 125 and 129 correspond to an address A3=0; and the comparators 126 and 130 correspond to an address A3=1, respectively. Further, a signal BIN is inputted to the comparators 127, 128, 129 and 130, respectively.

The respective outputs of the comparators 123 and 127 are inputted to an OR circuit 131. The respective outputs of the comparators 124 and 128 are inputted to an OR circuit 132. The respective outputs of the comparators 125 and 129 are inputted to an OR circuit 133. The respective outputs of the comparators 126 and 130 are inputted to an OR circuit 134.

Further, an output of a fuse circuit 135 is connected to the comparators 123, 124, 127 and 128, respectively. Further, an output of a fuse circuit 136 is connected to the comparators 125, 126, 129 and 130, respectively.

The fuse circuit 135 corresponds to addresses A2 to A8 on the address /A1 side; and the fuse circuit 136 corresponds to addresses A2 to A8 on the address A1 side, respectively. The conditions associated with the addresses A2, A3 and F are inputted from the fuse circuit 135 to a decoder 137; and the conditions associated with the addresses A2, A3 and F are inputted from the fuse circuit 136 to a decoder 138. The column select conditions of the lines A, C, E and G are outputted from the decoder 137, and the column select conditions of the lines B, D, F and H are outputted from the decoder 138, respectively.

The output S of an OR circuit 131 is checked with X on the /A3 side, and then inputted to two AND circuits 139 and 140. The AND circuit 139 inputs the column select conditions of the line A from the decoder 137, and outputs a signal SA. The AND circuit 140 inputs the column select conditions of the line C from the decoder 137, and outputs a signal SC. Here, an address /A3 is applied to the AND circuits 39 and 140 as the wrap conditions.

The output S of an OR circuit 132 is checked with Y on the A3 side, and then inputted to two AND circuits 141 and 142. The AND circuit 141 inputs the column select conditions of the line E from the decoder 137, and outputs a signal SE. The AND circuit 142 inputs the column select conditions of the line G from the decoder 137, and outputs a signal SG. Here, an address A3 is applied to the AND circuits 141 and 142 as the wrap conditions.

On the other hand, the output S of an OR circuit 133 is checked with the X on the /A3 side, and then inputted to two AND circuits 143 and 144. The AND circuit 143 inputs the column select conditions of the line B from the decoder 138, and outputs a signal SB. The AND circuit 144 inputs the column select conditions of the line D from the decoder 138, and outputs a signal SD. Here, an address /A3 is applied to the AND circuits 143 and 144 as the wrap conditions.

The output S of an OR circuit 134 is checked with the Y on the A3 side, and then inputted to two AND circuits 145 and 146. The AND circuit 145 inputs the column select conditions of the line F from the decoder 138, and outputs a signal SF. The AND circuit 146 inputs the column select conditions of the line H from the decoder 137, and outputs a signal SH. Here, an address A3 is applied to the AND circuits 145 and 146 as the wrap conditions.

Figure 5:
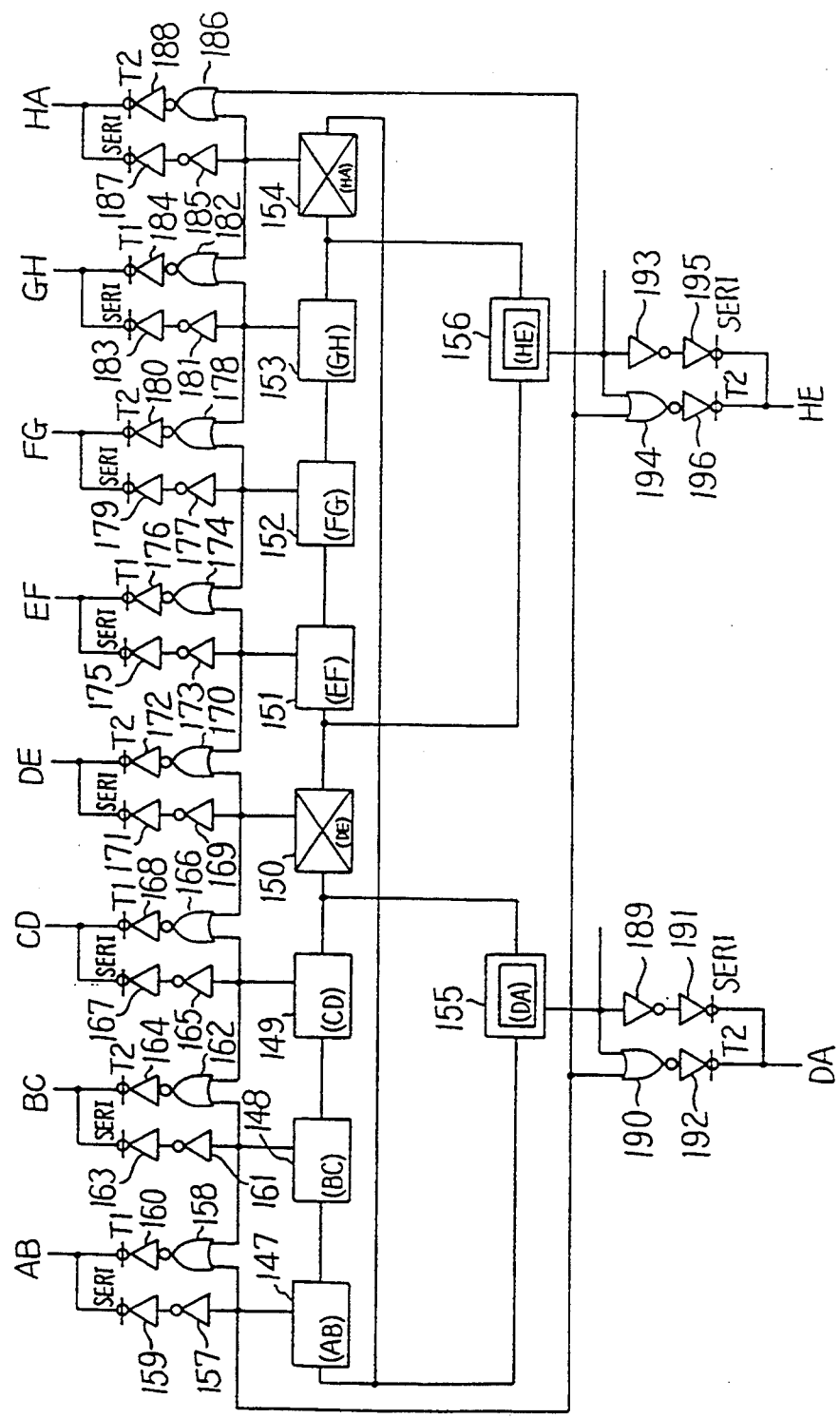
FIG. 5 is a circuit diagram showing a configuration of a selector circuit for selecting a pair of column select lines in the circuit device shown in FIG. 1.

FIG. 5 shows a circuit configuration of a selector for selecting a pair of column select lines. In FIG. 5, a column select signal generating circuit 147 generates a signal AB; a column select signal generating circuit 148 generates a signal BC; a column select signal generating circuit 149 generates a signal CD; a column select signal generating circuit 150 generates a signal DE; a column select signal generating circuit 151 generates a signal EF; a column select signal generating circuit 152 generates a signal FG; a column select signal generating circuit 153 generates a signal GH; a column select signal generating circuit 154 generates a signal HA; a column select signal generating circuit 155 generates a signal DA; and a column select signal generating circuit 156 generates a signal HE. These column select signal generating circuits 147 to 154 are all connected in series. Further, the column select signal generating circuits 147 to 149 and 155 are connected in series; and the column select signal generating circuits 151 to 154 and 156 are connected in series. Further, the column select signal generating circuits 147 to 149 and 151 to 153 are used in common; the column select signal generating circuits 150 and 154 are used for page; and the column select signal generating circuits 155 and 156 are used for wrap.

The output of the column select signal generating circuit 147 is inputted to an inverter 157 and a NOR circuit 158. The output of the inverter 157 is given to a clocked inverter 159 responsive to a clock signal SER1. Further, the output of a column select signal generating circuit 148 is given to the NOR circuit 158. The output of the NOR circuit 158 is given to a clocked inverter 160 responsive to a clock T1. The outputs of the clocked inverters 159 and 160 are outputted as the column select signal AB.

The output of the column select signal generating circuit 148 is inputted to an inverter 161 and a NOR circuit 162. The output of the inverter 161 is given to a clocked inverter 163 responsive to a clock signal SER1. Further, the output of a column select signal generating circuit 149 is given to the NOR circuit 162. The output of the NOR circuit 162 is given to a clocked inverter 164 responsive to a clock T2. The outputs of the clocked inverters 163 and 164 are outputted as the column select signal BC.

The output of the column select signal generating circuit 149 is inputted to an inverter 165 and a NOR circuit 166. The output of the inverter 165 is given to a clocked inverter 167 responsive to a clock signal SER1. Further, the output of two column select signal generating circuits 150 and 155 are given to the NOR circuit 166. The output of the NOR circuit 166 is given to a clocked inverter 168 responsive to a clock T1. The outputs of the clocked inverters 167 and 168 are outputted as the column select signal CD.

The output of the column select signal generating circuit 150 is inputted to an inverter 169 and a NOR circuit 170. The output of the inverter 169 is given to a clocked inverter 171 responsive to a clock signal SER1. Further, the output of a column select signal generating circuit 151 is given to the NOR circuit 170. The output of the NOR circuit 170 is given to a clocked inverter 172 responsive to a clock T2. The outputs of the clocked inverters 171 and 172 are outputted as the column select signal DE.

The output of the column select signal generating circuit 151 is inputted to an inverter 173 and a NOR circuit 174. The output of the inverter 173 is given to a clocked inverter 175 responsive to a clock signal SER1. Further, the output of a column select signal generating circuit 152 is given to the NOR circuit 174. The output of the NOR circuit 174 is given to a clocked inverter 176 responsive to a clock T1. The outputs of the clocked inverters 175 and 176 are outputted as the column select signal EF.

The output of the column select signal generating circuit 152 is inputted to an inverter 177 and a NOR circuit 178. The output of the inverter 177 is given to a clocked inverter 179 responsive to a clock signal SER1. Further, the output of a column select signal generating circuit 153 is given to the NOR circuit 178. The output of the NOR circuit 178 is given to a clocked inverter 180 responsive to a clock T2. The outputs of the clocked inverters 179 and 180 are outputted as the column select signal FG.

The output of the column select signal generating circuit 153 is inputted to an inverter 181 and a NOR circuit 182. The output of the inverter 181 is given to a clocked inverter 183 responsive to a clock signal SER1. Further, the outputs of two column select signal generating circuits 154 and 156 are given to the NOR circuit 182. The output of the NOR circuit 182 is given to a clocked inverter 184 responsive to a clock T1. The outputs of the clocked inverters 183 and 184 are outputted as the column select signal GH.

The output of the column select signal generating circuit 154 is inputted to an inverter 185 and a NOR circuit 186. The output of the inverter 185 is given to a clocked inverter 187 responsive to a clock signal SER1. Further, the output of the column select signal generating circuit 147 is given to the NOR circuit 186. The output of the NOR circuit 186 is given to a clocked inverter 188 responsive to a clock T2. The outputs of the clocked inverters 187 and 188 are outputted as the column select signal HA.

The output of the column select signal generating circuit 155 is inputted to an inverter 189 and a NOR circuit 190. The output of the inverter 189 is given to a clocked inverter 191 responsive to a clock signal SER1. Further, the output of the column select signal generating circuit 147 is given to the NOR circuit 190. The output of the NOR circuit 190 is given to a clocked inverter 192 responsive to a clock T2. The outputs of the clocked inverters 191 and 192 are outputted as the column select signal DA.

The output of the column select signal generating circuit 156 is inputted to an inverter 193 and a NOR circuit 194. The output of the inverter 193 is given to a clocked inverter 195 responsive to a clock signal SER1. Further, the output of the column select signal generating circuit 147 is given to the NOR circuit 194. The output of the NOR circuit 194 is given to a clocked inverter 196 responsive to a clock T2. The outputs of the clocked inverters 195 and 196 are outputted as the column select signal HE.

Figure 6A:
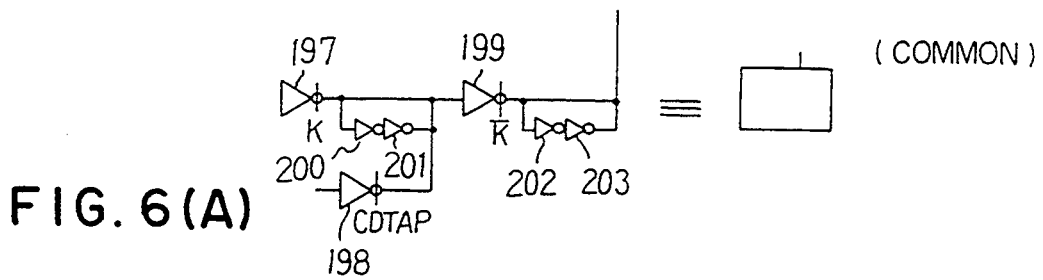
FIGS. 6(A) to 6(K) are circuit diagrams showing configurations of the elements for selecting the column select lines in the circuit device shown in FIG. 1.

FIGS. 6A to 6I show circuit configurations of elements for constituting the selectors of the column select lines. As shown in FIG. 6(A), the circuit for common use is configured as follows: the output of a clocked inverter 197 responsive to a basic clock signal K is connected to the output of a clocked inverter 198 responsive to a clock signal CD TAP via a self-hold circuit composed of two series and feedback connected inverters 200 and 201. Further, the output of this inverter 197 is connected to a clocked inverter 199 responsive to a basic clock signal /K. The output of the inverter 199 is outputted via a self-hold circuit composed of two series and feedback connected inverters 202 and 203.

Figure 6B:
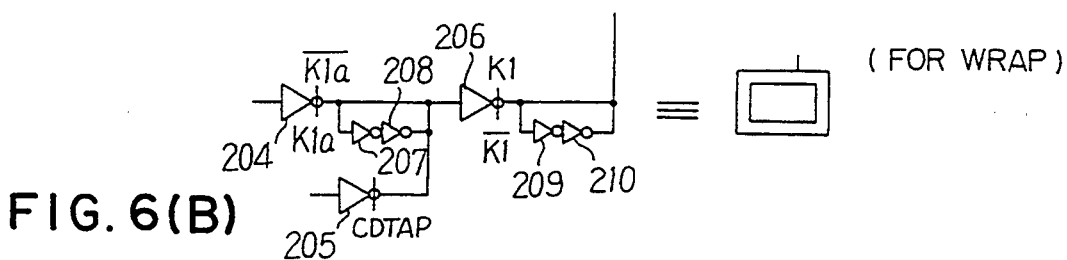

As shown in FIG. 6(B), the circuit for wrap use is configured as follows: the output of a clocked inverter 204 responsive to two basic clock signals /K1a and K1a is connected to the output of a clocked inverter 205 responsive to a clock signal CD TAP via a self-hold circuit composed of two series and feedback connected inverters 207 and 208. Further, the output of this inverter 204 is connected to a clocked inverter 206 responsive to two basic clock signals K1 and /K1. The output of the inverter 206 is outputted via a self-hold circuit composed of two series and feedback connected inverters 209 and 210.

Figure 6C:
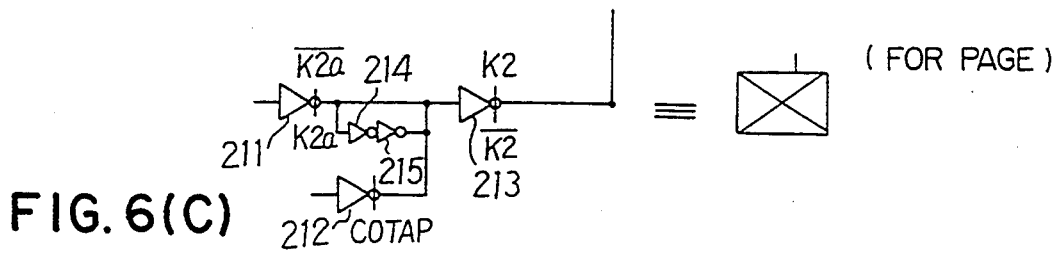

As shown in FIG. 6(C), the circuit for page use is configured as follows: the output of a clocked inverter 211 responsive to two basic clock signals /K2a and K2a is connected to the output of a clocked inverter 212 responsive to a clock signal CD TAP via a self-hold circuit composed of two series and feedback connected inverters 214 and 215. Further, the output of this inverter 211 is connected to a clocked inverter 213 responsive to two basic clock signals K2 and /K2. The output of the inverter 213 is outputted.

In FIG. 5, the column select signal generating circuits 147, 148, 149, 151, 152 and 153 are circuits for common use; the column select signal generating circuits 150 and 154 are circuits for wrap use; and the column select signal generating circuits 155 and 156 are circuits for page use, respectively.

Figure 6D:
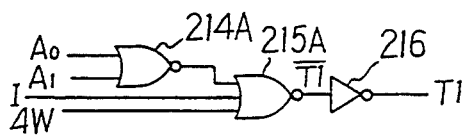

The signal T1 given to the clocked inverters 160, 168, 176 and 184 shown in FIG. 5 can be obtained as follows: as shown in FIG. 6(D), the addresses A0 and A1 are inputted to a NOR circuit 214A. The output of the NOR circuit 214A is inputted to a NOR circuit 215A to which a signal I (interleave signal) and 4W (4 wrap signal) are inputted. The NOR circuit 215A outputs a signal /T1. This output signal /T1 is outputted via an inverter 216 as the signal T1.

Figure 6E:
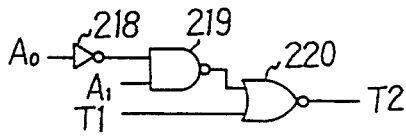

The signal T2 given to the clocked inverters 164, 172, 180, 188, 192 and 196 shown in FIG. 5 can be obtained as follows: as shown in FIG. 6(E), an address A0 is inverted by an invertor 218 and then inputted to a NAND circuit 219 to which the address A1 is inputted. The output of the NOR circuit 219 is inputted to a NAND circuit 220 to which a signal T1 is inputted. The output of the NOR circuit 220 is outputted as the signal T2.

Figure 6F:
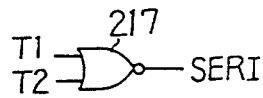

The signal SER1 given to the clocked inverters 159, 163, 167, 171, 175, 179, 183, 187, 191 and 193 shown in FIG. 5 can be obtained as follows: as shown in FIG. 6(F), the signals T1 and T2 are inputted to a NOR circuit 217, and outputted as the signal SER1.

Figure 6G:
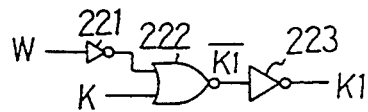

The basic signal /K1 given to the clocked inverter 206 for wrap use shown in FIG. 6(B) can be obtained as follows: as shown in FIG. 6(G), the signal W (wrap signal) is inverted by an inverter 122 and then inputted to a NOR circuit 222 to which the basic signal K is inputted. The output /K1 of the NOR circuit 222 is further inverted by an inverter 223 to output the signal K1.

Figure 6H:
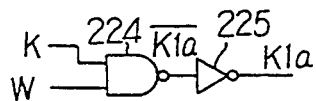

The basic signal /K1a given to the clocked inverter 204 for wrap use shown in FIG. 6(B) can be obtained as follows: as shown in FIG. 6(H), the basic signal K and the wrap signal. W are inputted to a NAND circuit 224. The output /K1a of the NAND circuit 224 is further inverted by an inverter 225 to output the signal K1a.

Figure 6I:
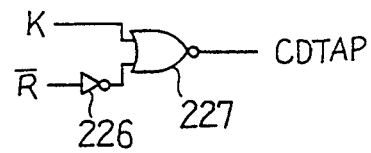

The signal CD TAP given to the clocked inverter 198, 205 and 212 for common use, wrap use and page use shown in FIG. 6(A), 6(B) and 6(C) can be obtained as follows: as shown in FIG. 6(I), a signal /R is inverted by an inverter 226 and then inputted to a NOR circuit 227 to which the basic signal K is inputted. The output of the NOR circuit 227 is outputted as the signal CD TAP.

Figure 6J:
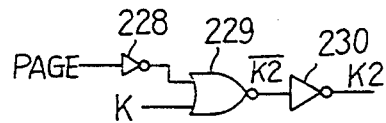

The basic signal K2 given to the clocked inverter 213 for page use shown in FIG. 6(C) can be obtained as follows: as shown in FIG. 6(J), the page signal PAGE is inverted by an inverter 228 and then inputted to a NOR circuit 229 to which the basic signal K is inputted. The output /K2 of the NOR circuit 229 is further inverted by an inverter 230 to output the signal K2.

Figure 6K:
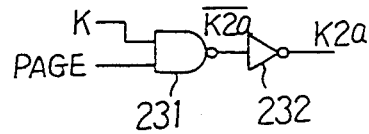

The basic signal K2a given to the clocked inverter 211 for page use shown in FIG. 6(C) can be obtained as follows: as shown in FIG. 6(K), the basic signal K and the page signal PAGE are both inputted to a NAND circuit 231. The output /K2a of the NAND circuit 231 is further inverted by an inverter 232 to output the signal K2a.

FIGS. 7A to 7D show circuit configurations of decoders for determining the heads of the column selects operated in accordance with Table 1 to Table 5.

Figure 7A:
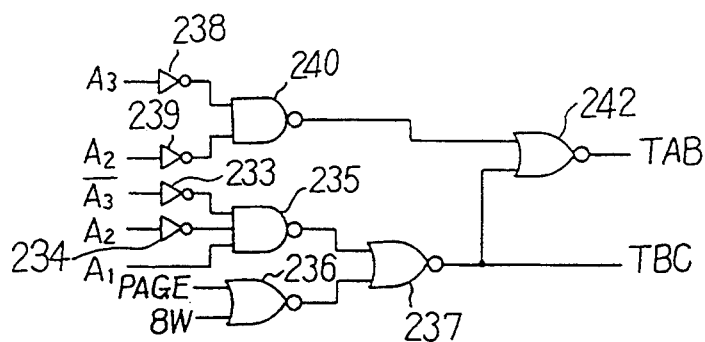
FIGS. 7(A) to 7(D) are circuit diagrams showing configurations of the decoders for setting the head portions of the column select lines in the circuit device shown in FIG. 1.

As shown in FIG. 7(A), the signal TBC can be obtained as follows: the address /A3 is inverted by an inverter 233 and the address A2 is inverted by an inverter 234. The inverted addresses /A3 and A2 are both inputted to a NAND circuit 235 to which the address A1 is inputted. On the other hand, the page signal PAGE and the signal 8W are inputted to a NOR circuit 236. The outputs of the NAND circuit 235 and the NOR circuit 236 are both inputted to a NOR circuit 237 to obtain the signal TBC. On the other hand, the TAB can be obtained as follows: the address A3 is inverted by an inverter 238 and the address A2 is inverted by an inverter 239. The inverted addresses A3 and A2 are both inputted to a NAND circuit 240. Further, the output of the NOR circuit 237 is inverted by an inverter 241. The inverted output of the NOR circuit 237 and the output of the NAND circuit 240 are both inputted to a NOR circuit 242 to obtain the signal TAB.

Figure 7B:
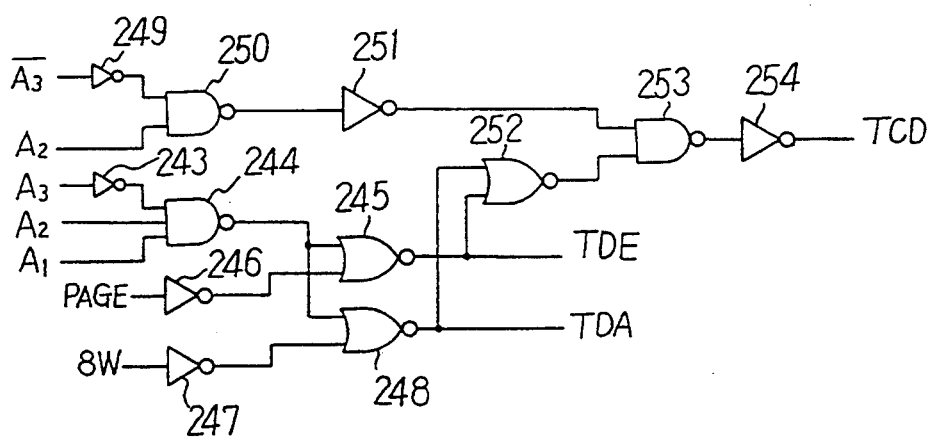

As shown in FIG. 7(B), the signal TDE can be obtained as follows: the address A3 is inverted by an inverter 243. The inverted address A3 and the addresses A2 and A1 are all inputted to a NAND circuit 244. On the other hand, the page signal PAGE is inverted by an inverter 246. The outputs of the NAND circuit 244 and the inverted page signal PAGE are both inputted to a NOR circuit 245 to obtain the signal TDE. On the other hand, the signal TDA can be obtained as follows: the signal 8W is inverted by an inverter 247. The output of the NAND circuit 244 and the inverted signal 8W are both inputted to a NOR circuit 248 to obtain the signal TDA. The signal TCD can be obtained as follows: the address /A3 is inverted by an inverter 249. The inverted address /A3 and the address A2 are both inputted to a NAND circuit 250. The output of the NAND circuit 250 is inverted by an inverter 251. On the other hand, the outputs of the two NOR circuits 245 and 248 are both inputted to a NOR circuit 252. The output of the NAND circuit 250 is inverted by an inverter 251 and then inputted to a NAND circuit 253 to which the output of the NOR circuit 252 is inputted. The output of the NAND circuit 253 is further inverted by an inverter 254 to obtain the signal TCD.

Figure 7C:
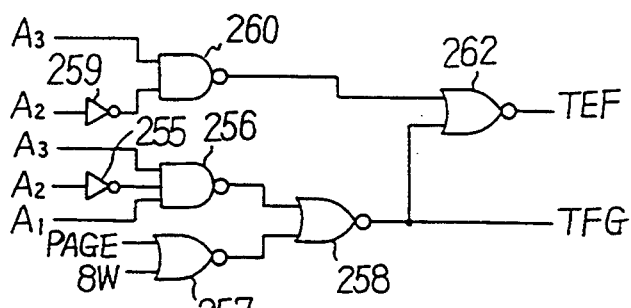

As shown in FIG. 7(C), the signal TFG can be obtained as follows: the address A2 is inverted by an inverter 255. The inverted address A2 is inputted to a NAND circuit 256 to which the addresses A3 and A1 are inputted. On the other hand, the page signal PAGE and the signal 8W are both inputted to a NOR circuit 257. The outputs of the NAND circuit 256 and the NOR circuit 257 are both inputted to a NOR circuit 258 to obtain the signal TFG. On the other hand, the TEF can be obtained as follows: the address A2 is inverted by an inverter 259. The inverted address A2 is inputted to a NAND circuit 260 to which the address A3 is inputted. On the other hand, the output of the NOR circuit 258 is inverted by an inverter 261 and then inputted to a NOR circuit 262 to which the output of the NAND circuit 260 is inputted to obtain the signal TEF.

Figure 7D:
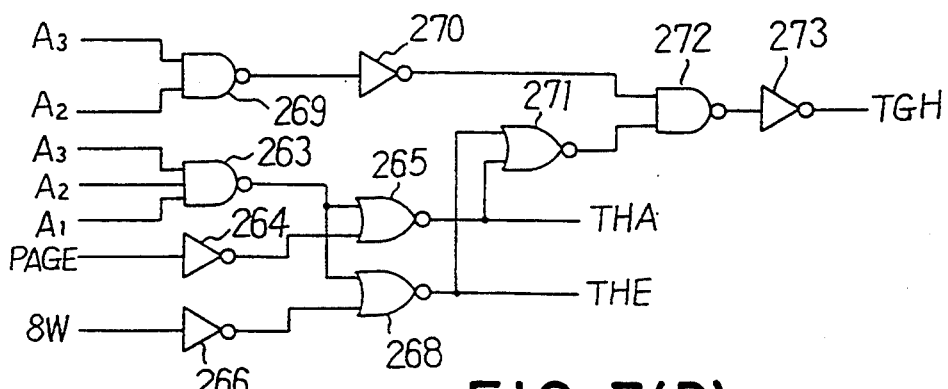

As shown in FIG. 7(D), the signal THA can be obtained as follows: the addresses A3, A2 and A1 are all inputted to a NAND circuit 263. On the other hand, the page signal PAGE is inverted by an inverter 264. The outputs of the NAND circuit 263 and the inverted page signal PAGE are both inputted to a NOR circuit 265 to obtain the signal THA. On the other hand, the signal THE can be obtained as follows: the signal 8W is inverted by an inverter 266. The output of the NAND circuit 263 and the inverted signal 8W are both inputted to a NOR circuit 268 to obtain the signal THE. The signal TGH can be obtained as follows: the address A3 and the address A2 are both inputted to a NAND circuit 269. The output of the NAND circuit 269 is inverted by an inverter 270. On the other hand, the outputs of the two NOR circuits 265 and 268 are both inputted to a NOR circuit 271. The inverted output of the NAND circuit 269 and the output of the NOR circuit 271 are both inputted to a NAND circuit 272 and further inverted by an inverter 273 to obtain the signal TGH.

Figure 8A:
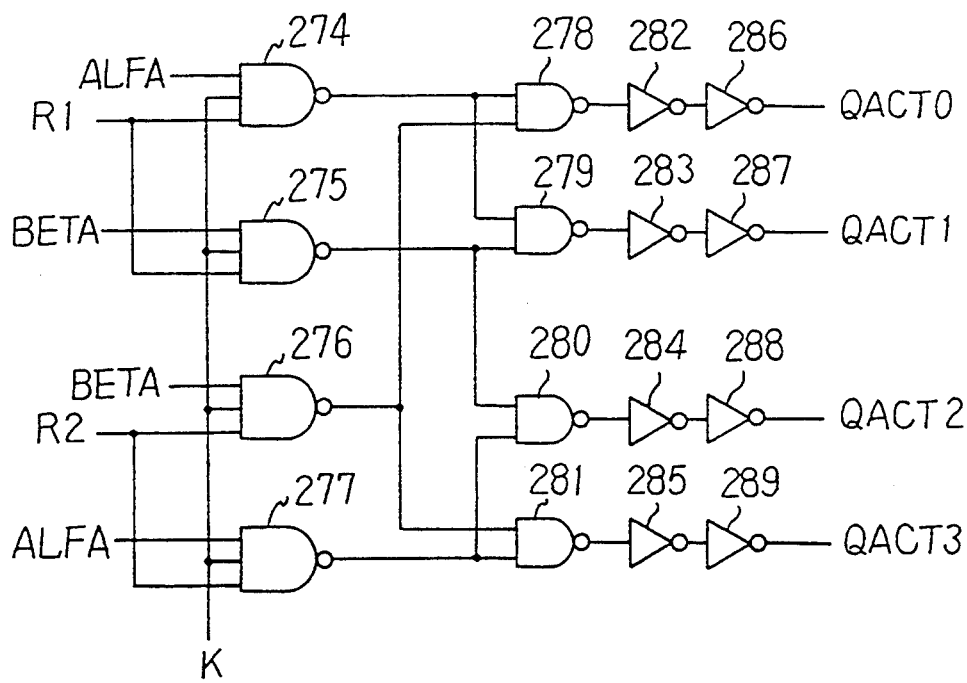
FIGS. 8(A) to 8(C) are circuit diagrams showing configurations of the circuits for applying data activating signals to the data buffer in the circuit device shown in FIG. 1.
Figure 8B:
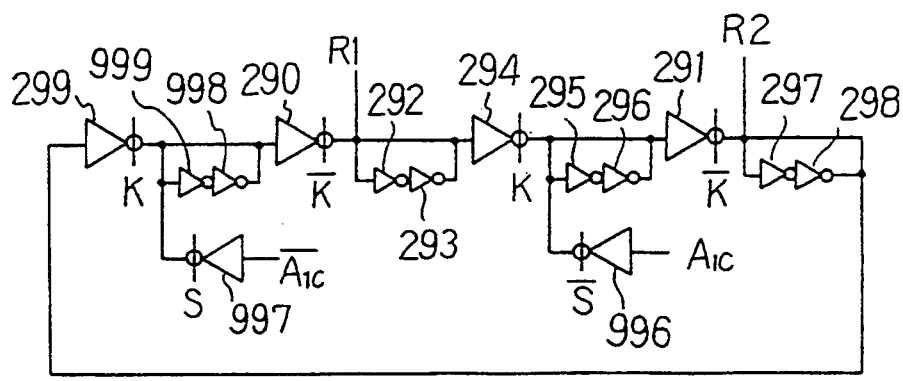
Figure 8C:
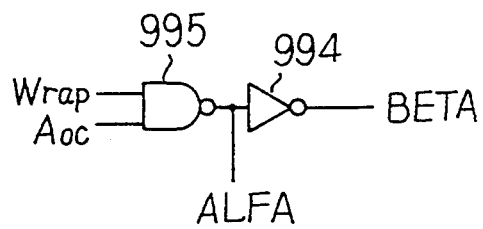

FIGS. 8A to 8C show circuit configurations for generating data activating lines QACT0 to QACT2 signals applied to the data buffer 2 to select the to select buffer sections 20 to 23. As shown in FIG. 8(A), a signal ALFA is given to two NAND circuits 274 and 277; and a signal BETA is given to two NAND circuits 275 and 276. On the other hand, a signal R2 is given to two circuits 274 and 275; and a signal R2 is given to two NAND circuits 276 and 277. The output of the NAND circuit 274 is given to two NAND circuits 278 and 279; the output of the NAND circuit 275 is given to two NAND circuits 279 and 280; the output of the NAND circuit 276 is given to two NAND circuits 278 and 28.1; and the output of the NAND circuit 277 is given to the two NAND circuits 280 and 281. Further, the output of the NAND circuit 278 is derived via two inverters 282 and 286 as the data activation line QACT0. The output of the NAND circuit 279 is derived via two inverters 283 and 287 as the data activation line QACT1. Further, the output of the NAND circuit 280 is derived via two inverters 284 and 288 as the data activation line QACT2. The output of the NAND circuit 281 is derived via two inverters 285 and 289 as the data activation line QACT3.

As shown in FIG. 8(B), the signal R1 can be obtained as the output of a clocked inverter 290 responsive to the clock signal /K, and the signal R2 can be obtained as the output of a clocked inverter 291 responsive to the clock signal /K.

As shown in FIG. 8(B), the output of a clocked inverter 299 responsive to the basic clock signal K is connected to the output of a clocked inverter 290 responsive to the signal /K via a self-hold circuit composed of two series and feedback connected inverters 999 and 998. Further, the output of this clocked inverter 290 responsive to the signal /K is connected to a clocked inverter 294 responsive to the basic clock signal K via a self-hold circuit composed of two series and feedback connected inverters 292 and 293.

Further, the output of the clocked inverter 294 responsive to the basic clock signal K is connected to a clocked inverter 291 responsive to the signal /K via a self-hold circuit composed of two series and feedback connected inverters 295 and 296. Further, the output of this clocked inverter 291 responsive to the signal /K is connected to the clocked inverter 299 responsive to the basic clock signal K via a self-hold circuit composed of two series and feedback connected inverters 297 and 298. Further, the address /A1c is applied to the input of the clocked inverter 290 via a clocked inverter 997 responsive to the clock signal S; and the address A1c is applied to the input of the clocked inverter 291 via a clocked inverter 996 responsive to a clock signal /S. Here, the signal /S is a signal whose level is high when the first signal K (obtained after the cycle in which the column select signal is low) is low.

Further, as shown in FIG. 8(C), the signal ALFA can be obtained as the output of a NAND circuit 995 to which the signal Wrap and the address A0c are inputted. The signal BETA can be obtained by further inverting the output ALFA of the NAND circuit 995 by an inverter 994. Here, the signal ALFA corresponds to the address /A0 in the interleave and wrap modes; and the signal BETA corresponds to the address A0 in the wrap mode. Further, the signal R1 corresponds to the address A1, and the signal R2 corresponds to the address A0. The relationship between these is listed in Tables 12 and 13, respectively.

The operation of the circuits configured as described above with reference to FIGS. 1 and 8 will be described hereinbelow with reference to the Tables 1 to 5 (the description of column activation sequences) and Tables 6 to 10 (the description of column selection). Tables 6 to 10 list each operation associated with the selection of the column select lines at each tap address in the page mode, the 8-wrap mode, the 8-interleave mode, the 4-wrap mode, and the 4-interleave mode, respectively. In these tables, KIND designates the operation modes in which A indicates an alternate operation and S indicates a serial operation, and HEAD designates the head lines to be first activated among AA to HA. Further, with respect to SIGNAL T1, T2 and SERI, the SIGNAL is T1 in the case of either of the interleave mode or the 4-wrap mode or (/A1, /A0); T2 in the case of the modes other than the mode represented by T1; and SERI in the case of modes other than the mode represented by T1 and T2, as shown in FIGS. 6(D), 6(E) and 6(F).

On the basis of the lines AA to HA selected by the circuits configured as shown in FIGS. 6 and 7, two of the column select drive lines /CDRV as shown in FIG. 3(A) can be selected. In this case, when the basic signal K is at a high level, two column select drive lines /CDRV are activated. Further, where it is necessary to replace the normal column select lines with the spare column select lines, it is possible to replace the normal column select line with the spare column select line one by one. The spare/normal discriminating circuit shown in FIG. 4 detects which pair A to H of the column select drive lines /CDRV is spare. In this case, any one of the lines A, C, E and G is selected and any one of the lines B, D, F and H is selected to selectively activate the spare column signals SA to SH. In the circuit configuration show in FIG. 3(A), the selected ones of the spare column signals /SA to /SH are at a low level, so that only the column select drive lines /CDRV corresponding thereto are deactivated. For instance, when the signal /SA is low and the signal AB is high, only A of the column select drive line /CDRV is deactivated and B of the spare column select line SCSL ACEG is activated, with the result that 4 data can be read from the core selection 5.

Thereafter, two of the read data are sensed by the circuits configured as shown in FIG. 8(A) in accordance with the mode and the tap address as shown in Table 11. Further, the conditions of the signals ALFA and BETA and the signals R1 and R2 are all listed in Tables 12 and 13, respectively. Here, the interleave and wrap /A$_0$ of the signal ALFA implies that the tap address /A0 is "1" or "0" in the interleave mode or the wrap mode. The wrap A$_0$ of the signal BETA implies that the tap address A0 is "1" or "0".

Figure 9:
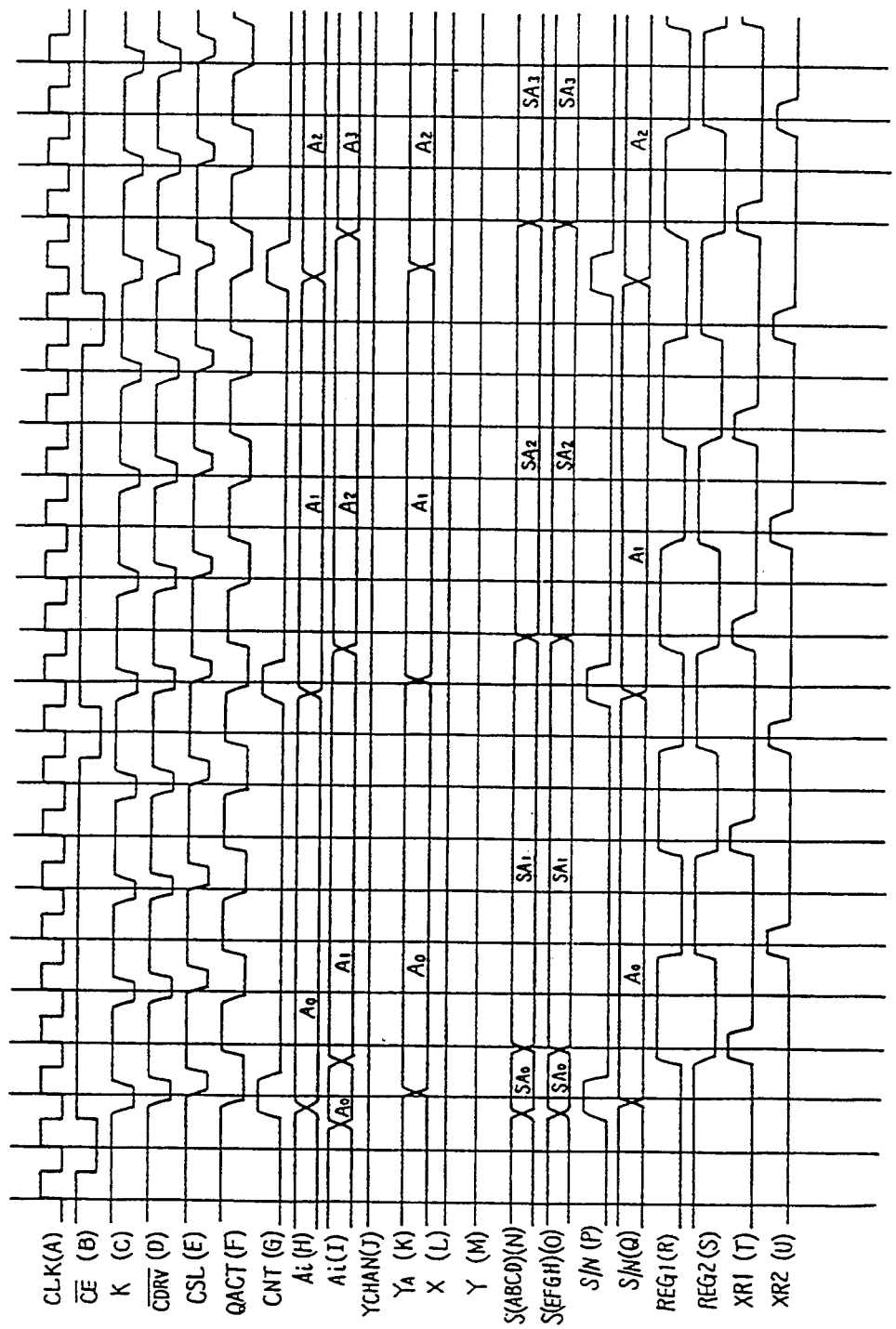
FIG. 9 is a timing chart for assistance in explaining the operation of the 8-wrap mode in the circuit device shown in FIG. 1.

When two of the data activation lines QACT0 to QACT3 are selectively activated in the circuit configuration shown in FIG. 8(A), it is possible to selectively output data from the buffer section 5 to the read and write data lines RWD0 to RWD1 via the buffer section 21 to 24 of the data buffer 2. These sequential operations are shown by timing charts in FIGS. 9 and 10. FIG. 9 shows the operation in the 8-wrap mode, in which (A) designates the clock CLK; (B) designates the chip activation signal /CE; (C) designates the basic signal K; (D) designates the column select drive line /CDRV; (E) designates the column select signal CSL; (F) designates the data activation line signal QACT; (G) designnates the counter signal CNT; (H) designates the change in address Ai of the counter 120; (J) designates the status of the Y-channel YCHA; (K) designates the partial decode signal YA; (L) designates the signal X; (M) designates the signal Y; (N) designates the status of the spare address of the spare column select-line SCSL ACEG; (O) designates the status of the spare address of the spare column select line SCSL BDFH; (P) designates the acquisition status of the spare/normal discriminating signal S/N; (Q) designates the spare/normal discriminating signal S/N; (R) designates the signal R1 (REG1) applied to the scrambler 15 for selecting the register sections 11 and 12 of the data register 1; (S) designates the signal R2 (REG2) applied to the scrambler 16 for selecting the register sections 13 and 14 of the data register 1; and (T) and (U) designate the signals XR1 and XR2, respectively.

Figure 10:
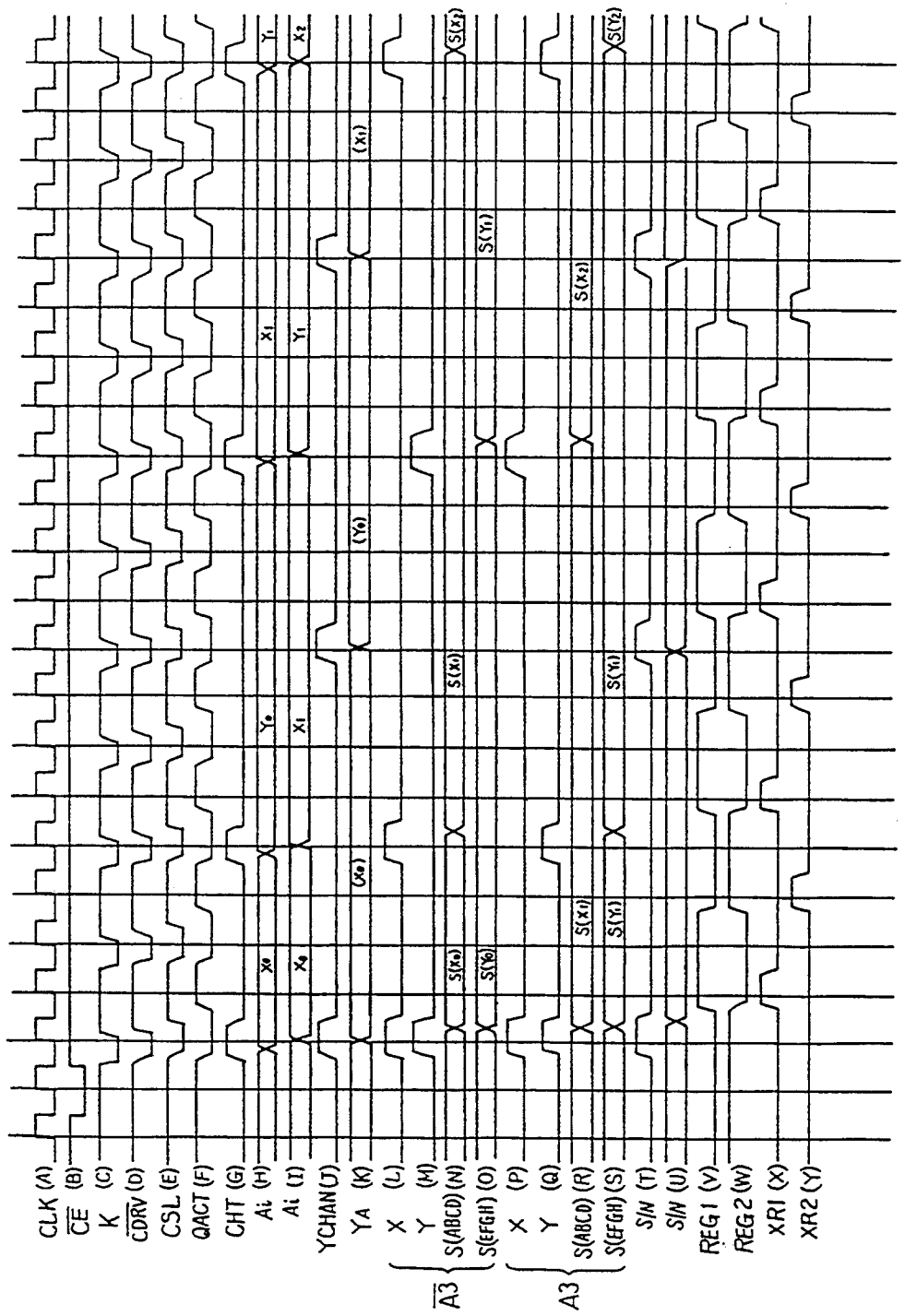
FIG. 10 is a timing chart for assistance in explaining the operation of the page mode in the circuit device shown in FIG. 1.

On the other hand, FIG. 10 shows the operation in the page mode, in which (A) designates the clock CLK; (B) designates the chip activation signal /CE; (C) designates the basic signal K; (D) designates the column select drive line /CDRV; (E) designates the column select signal CSL; (F) designates the data activation line signal QACT; (G) designates the counter signal CNT; (H) designates the change in address Ai of the counter 120; (J) designates the status of the Y-channel YCHA; (K) designates the partial decode signal YA; (L) designates the signal X at the address /A3; (M) designates the signal Y at the address /A3; (N) designates the status of the spare address of the spare column select line SCSL ACEG at the address /A3; (O) designates the status of the spare address of the spare column select line SCSL BDFH at the address /A3; (P) designates the signal X at the address A3; (Q) designates the signal Y at the address A3; (R) designates the status of the spare address of the spare column select line SCSL ACEG at the address A3; (S) designates the status of the spare column select line SCSL BDFH at the address A3; (T) designates the acquisition status of the spare/normal discriminating signal S/N; (U) designates the spare/normal discriminating signal S/N; (V) designates the signal R1 (REG1) applied to the scrambler 15 for selecting the register sections 11 and 12 of the data register 1; (W) designates the signal R2 (REG2) applied to the scrambler 16 for selecting the register sections 13 and 14 of the data register 1; and (X) and (Y) designate the signals XR1 and XR2, respectively.

Figures 12A, 12B:
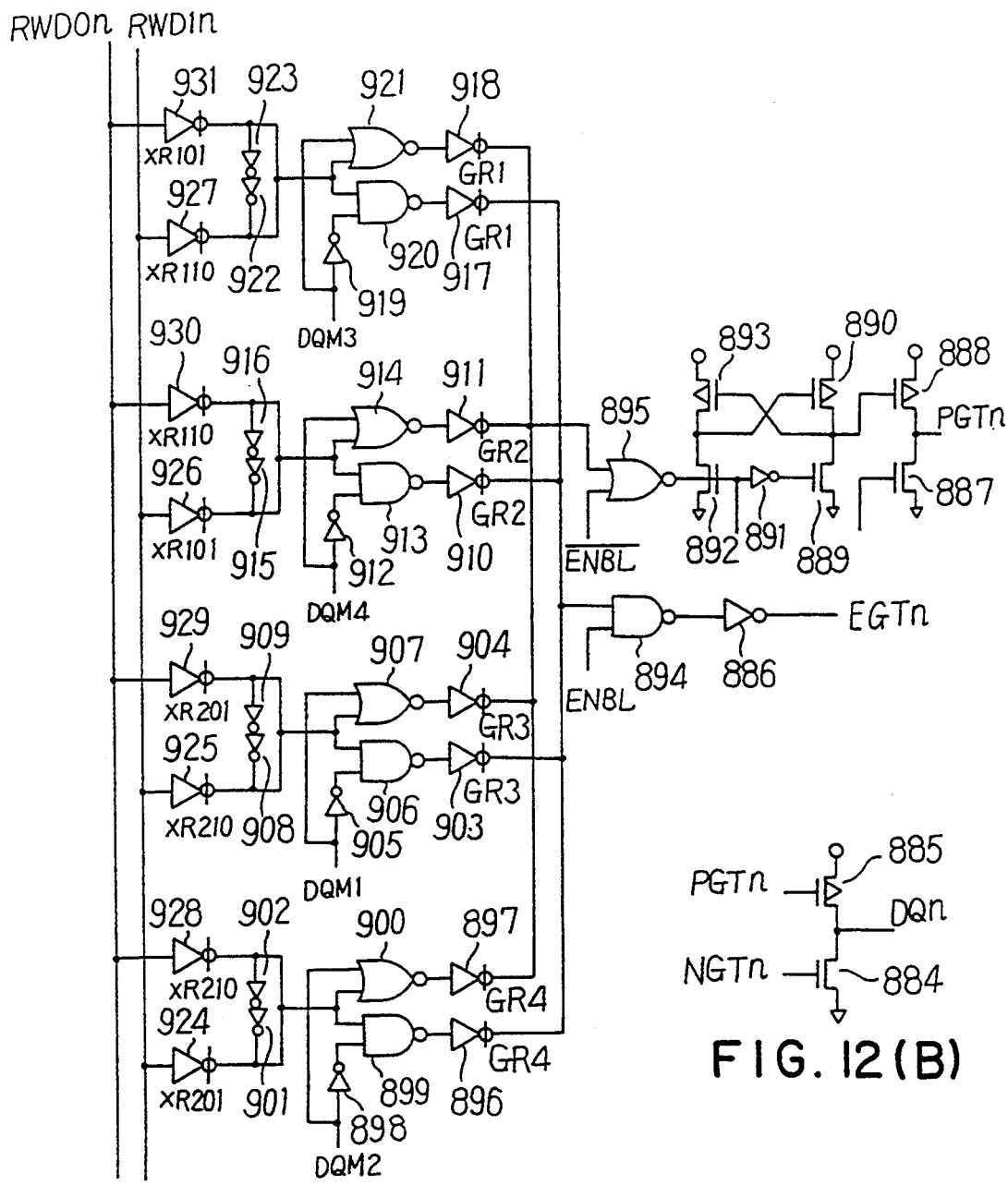
FIGS. 12(A) and 12(B) are circuit diagrams showing configurations of the read data registers in the circuit device shown in FIG. 1.

In the read mode, data on the read and write data lines RWD are read in the read data register as shown in FIG. 12(A) in response to one of pulse signals XR101 to XR201 in accordance with the tap address A0. On the other hand, in the write mode, data read in the write data register as shown in FIG. 12(A) are divided 2 bits by 2 bits and then outputted to the read and write data lines RWD. In this case, one of the REG 101 to REG 210 is selected in accordance with the tap address A0 and thereafter the scrambled data are given to the read and write data lines RWD.

Figure 11A:
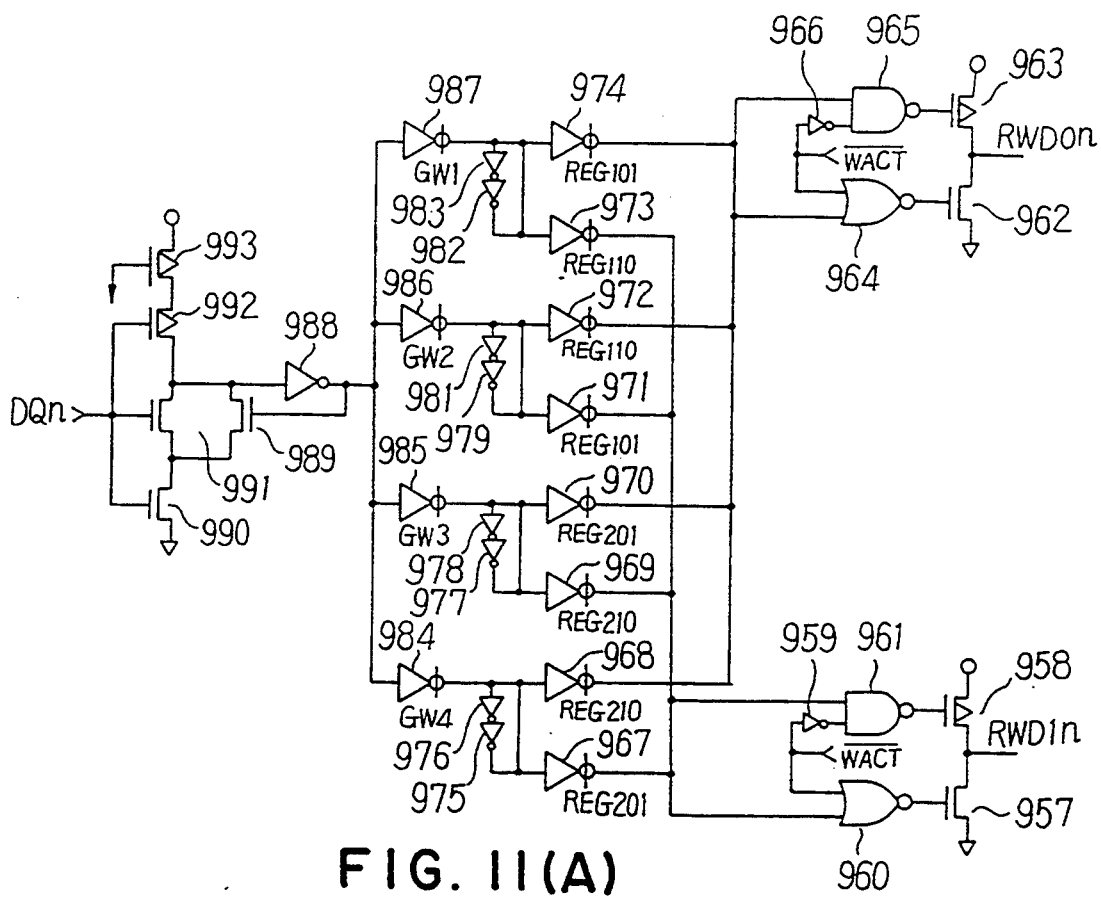
FIGS. 11(A) to 11(C) are circuit diagrams showing configurations of the write registers in the circuit device shown in FIG. 1.

In more detail, in FIG. 11(A), an input data DQn is inputted to the gate of a transistor 991 of a series circuit composed of transistors 993, 992 991 and 990 and then outputted from the drain of the transistor 991. The outputted data is further outputted via an inverter 988. The output of the inverter 988 is given to the gate of a transistor 989 connected between the drain and the source of the transistor 991. The output of the inverter 988 is inputted to four clocked inverters 987, 986, 985 and 984. A clock signal GW1 is applied to the clocked inverter 987; a clock signal GW2 is applied to the clocked inverter 986; a clock signal GW3 is applied to the clocked inverter 985; and a clock signal GW4 is applied to the clocked inverter 984. Further, the output of the clocked inverter 987 is given to two clocked inverters 974 and 973 via a self-hold circuit composed of two series and feedback connected inverters 983 and 982. The output of the clocked inverter 986 is given to two clocked inverters 972 and 971 via a self-hold circuit composed of two series and feedback connected inverters 981 and 979. Further, the output of the clocked inverter 985 is given to two clocked inverters 970 and 969 via a self-hold circuit composed of two series and feedback connected inverters 978 and 977. The output of the clocked inverter 984 is given to two clocked inverters 968 and 967 via a self-hold circuit composed of two series and feedback connected inverters 976 and 975. Further, the signal REG 101 is given as a clock to the clocked inverters 974 and 971; the signal REG 110 is given as a clock to the clocked inverters 973 and 972; the signal REG 201 is given as a clock to the clocked inverters 970 and 967; and the signal REG 210 is given as a clock to the clocked inverters 969 and 968. The outputs of the clocked inverters 974, 972, 970 and 968 are given to a NAND circuit 965 and an OR circuit 964; the outputs of the clocked inverters 973, 971, 969 and 967 are given to a NAND circuit 961 and a NOR circuit 960. Further, a signal /WACT is inputted to the NOR circuit 964 directly and to the NAND circuit 965 via an inverter 966. On the other hand, a signal /WACT is inputted to a NOR circuit 960 directly and to a NAND circuit 961 via an inverter 959. The output of a NAND circuit 965 is inputted to the gate of a P-type transistor 963; and the output of a NOR circuit 964 is inputted to the gate of an N-type transistor 962. The read data RWD0n can be obtained from a junction point (drain) of the two transistors 963 and 962. The output of a NAND circuit 961 is inputted to the gate of a P-type transistor 958; and the output of a NOR circuit 960 is inputted to the gate of an N-type transistor 957. The read data RWD1n can be obtained from a junction point (drain) of the two transistors 958 and 957.

The signal REG 101 can be obtained as follows: in FIG. 11(B), an address A0c is inputted to a clocked inverter 956 responsive to a clock signal /REG1. The output of the clocked inverter 956 is inputted to a NAND circuit 953 via a self-hold circuit composed of two series and feedback connected inverters 955 and 954. The signal REG1 is also inputted to the NAND circuit 953. The output of the NAND circuit 953 is inverted by an inverter 952 to obtain the signal REG 101.

The signal REG 110 can be obtained as follows: in FIG. 11(B), the output of the clocked inverter 956 is inverted by an inverter 951 and then inputted to a NAND circuit 950. The signal REG1 is also inputted to the NAND circuit 950. The output of the NAND circuit 950 is further inverted by an inverter 949 to obtain the signal REG 110.

Further, the signal REG 201 can be obtained as follows: in FIG. 11(B), an address A0c is inputted to a clocked inverter 948 responsive to a clock signal /REG2. The output of the clocked inverter 948 is inputted to a NAND circuit 945 via a self-hold circuit composed of two series and feedback connected inverters 947 and 946. The signal REG2 is also inputted to the NAND circuit 945. The output of the NAND circuit 945 is inverted by an inverter 944 to obtain the signal REG 201.

Figure 11B:
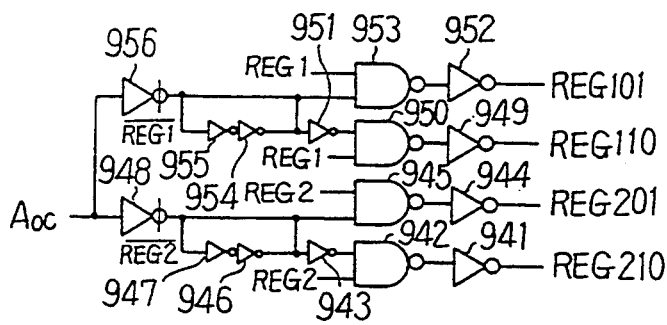

The signal REG 210 can be obtainedas follows: in FIG. 11(B), the output of the clocked inverter 948 is inverted by an inverter 943 and then inputted to a NAND circuit 942. The signal REG2 is also inputted to the NAND circuit 942. The output of the NAND circuit 942 is further inverted by an inverter 941 to obtain the signal REG 210.

Figure 11C:
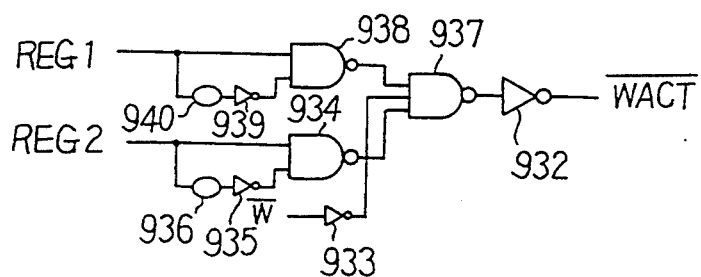

Further, the signal /WACT can be obtained as follows: in FIG. 11(C), the signal REG1 is inputted to a NAND circuit 938 directly and further via a series circuit of a delay circuit 940 and an inverter 939. Further, the signal REG2 is inputted to a NAND circuit 934 directly and further via a series circuit of a delay circuit 936 and an inverter 935. The outputs of both the NAND circuits 938 and 934 are inputted to a NAND circuit 937 to which the signal /W is inputted via an inverter 933. The output of the NAND circuit 937 is inverted by an inverter 932 to obtain the signal /WACT.

In FIG. 12(A), the read and write data RWD0n are inputted to a clocked inverter 931 responsive to a clock signal XR 101, a clocked inverter 930 responsive to a clock signal XR 110, a clocked inverter 929 responsive to a clock signal XR 201, and a clocked inverter 928 responsive to a clock signal XR 210. The read and write data RWD1n are inputted to a clocked inverter 927 responsive to a clock signal XR 110, a clocked inverter 926 responsive to a clock signal XR 101, a clocked inverter 925 responsive to a clock signal XR 210, and a cloeked inverter 924 responsive to a clock signal XR 201.

The outputs of the clocked inverters 931 and 927 are inputted to a NOR circuit 921 and a NAND circuit 920 via a self-hold circuit composed of two series and feedback connected inverters 923 and 922. A signal DQM3 is inputted to the NOR circuit 921 directly and to the NAND circuit 920 via, an inverter 919. The output of the NOR circuit 921 is inputted to a clocked inverter 918 responsive to a clock signal GR1, and the output of the NAND circuit 920 is inputted to a clocked inverter 917 responsive to a clock signal GR1.

The outputs of the clocked inverters 930 and 926 are inputted to a NOR circuit 914 and a NAND circuit 913 via a self-hold circuit composed of two series and feedback connected inverters 916 and 915. A signal DQM4 is inputted to the NOR ,circuit 914 directly and to the NAND circuit 913 via an inverter 912. The output of the NOR circuit 914 is inputted to a clocked inverter 911 responsive to a clock signal GR2, and the output of the NAND circuit 913 is inputted to a clocked inverter 910 responsive to a clock signal GR2.

The outputs. of the clocked inverters 929 and 925 are inputted to a NOR circuit 907 and a NAND circuit 906 via a self-hold circuit composed of two series and feedback connected inverters 909 and 908. A signal DQM1 is inputted to the NOR circuit 907 directly and to the NAND circuit 906 via an inverter 905. The output of the NOR circuit 907 is inputted to a clocked inverter 904 responsive to a clock signal GR3, and the output of the NAND circuit 906 is inputted to a clocked inverter 903 responsive to a clock signal GR3.

The outputs of the clocked inverters 928 and 924 are inputted to a NOR circuit 900 and a NAND circuit 899 via a self-hold circuit composed of two series and feedback connected inverters 902 and 901. A signal DQM2 is inputted to the NOR circuit 900 directly and to the NAND circuit 899 via an inverter 898. The output of the NOR circuit 900 is inputted to a clocked inverter 897 responsive to a clock signal GR4, and the output of the NAND circuit 899 is inputted to a clocked inverter 896 responsive to a clock signal GR4.

Further, the respective outputs of the clocked inverters 918, 911, 904, and 897 are all inputted to a NOR circuit 895 to which an signal /ENBL is inputted. On the other hand, the respective outputs of the clocked inverters 917, 910, 903, and 896 are all inputted to a NOR circuit 894 to which an signal ENBL is inputted.

The output of the NOR circuit 895 is inputted to the gates of two N-type transistors 892 and 887, and further to a N-type transistor 889 via an inverter 891. The drain of the transistor 892 is connected to the drain of a P-type transistor 893 and the gate of a P-type transistor 890. The drain of the transistor 889 is connected to the gate of the P-type transistor 893, the drain of the P-type transistor 890, and the gate of a P-type transistor 888. A signal PGTn can be derived from a junction point (drain) of the two transistors 888 and 887.

Further, the output of the NAND circuit 894 is inverted by an inverter 886 to output a signal EGTn.

Further, as shown in FIG. 12(B), the signal PGTn is inputted to the gate of a P-type transistor 885 and the signal NGTn is inputted to the gate of an N-type transistor 884, in order to obtain data DQn from a junction point between the drains of the two transistors 885 and 884.

FIGS. 13A to 13D show circuit configurations for generating control signals for transferring read data in the circuit shown in FIG. 12(A). As shown in FIG. 13(A), the signal XR 101 can be obtained as follows: the signal /W is inputted to a NOR circuit 871 via an inverter 883; and the signal /REG 101 is inputted to the NOR circuit 871 directly and further via a delay circuit 875 and an inverter 882. The output of the NOR circuit 871 is derived via two inverters 867 and 863 to obtain the signal XR 101.

As shown in FIG. 13(B), the signal XR 110 can be obtained as follows: the signal /W is inputted to a NOR circuit 870 via an inverter 881; and the signal /REG 110 is inputted to the NOR circuit 870 directly and further via a delay circuit 874 and an inverter 880. The output of the NOR circuit 870 is derived via two inverters 866 and 862 to obtain the signal XR 110.

As shown in FIG. 13(C), the signal XR 201 can be obtained as follows: the signal /W is inputted to a NOR circuit 869 via an inverter 879; and the signal /REG 201 is inputted to the NOR circuit 869 directly and further via a delay circuit 873 and an inverter 878. The output of the NOR circuit 869 is derived via two inverters 865 and 865 to obtain the signal XR 201.

As shown in FIG. 13(D), the signal XR 210 can be obtained as follows: the signal /W is inputted to a NOR circuit 868 via an inverter 877; and the signal /REG 210 is inputted to the NOR circuit 868 directly and further via a delay circuit 872 and an inverter 876. The output of the NOR circuit 868 is derived via two inverters 864 and 860 to obtain the signal XR 210.

Figure 14:
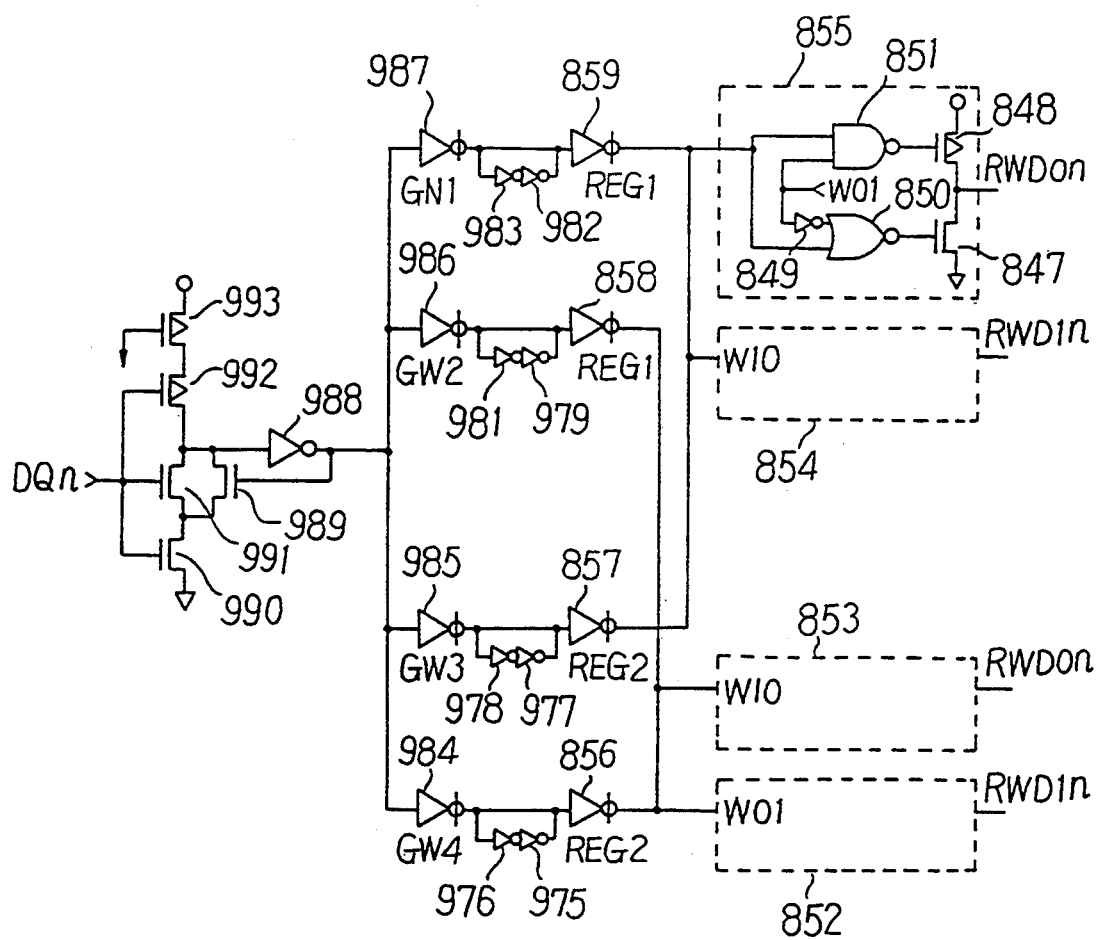
FIG. 14 is a circuit diagram showing another configuration of the write data register.

FIG. 14 shows another circuit configuration of the write data register. In the drawing, the points different from that shown in FIG. 11(A) are as follows: the output of a clocked inverter 987 is given to a clocked inverter 859 responsive to a clock signal REG1. The output of a clocked inverter 986 is given to a clocked inverter 858 responsive to a clock signal REG1. The output of a clocked inverter 985 is given to a clocked inverter 857 responsive to a clock signal REG2. The output of a clocked inverter 984 is given to a clocked inverters 856 responsive to a clock signal REG2. The outputs of the two clocked inverters 859 and 857 are inputted to two output circuits 855 and 854 to obtain data RWD0n and RWD1n, respectively. Further, the outputs of the two clocked inverters 858 and 856 are inputted to two output circuits 853 and 852 to obtain data RWD0n and RWD1n, respectively. Here, in the output circuit 855, the outputs of the clocked inverters 859 and 857 are directly given to a NAND circuit 851 and a NOR circuit 850, and further the signal W01 is given to the NAND circuit 851 directly and to the NOR circuit 850 via an inverter 849. The output of the NAND circuit 851 is given to the gate of a P-type transistor 848, and the output of the NOR circuit 850 is given to the gate of an N-type transistor 847. The data RW0n can be obtained from a junction point between the two transistors 848 and 847. The other output circuits 854, 853 and 852 are almost the same as above, except the signal given to the NAND circuit and NOR circuit is the signal WR10 in the case of the output circuits 854 and 853.

Figure 15:
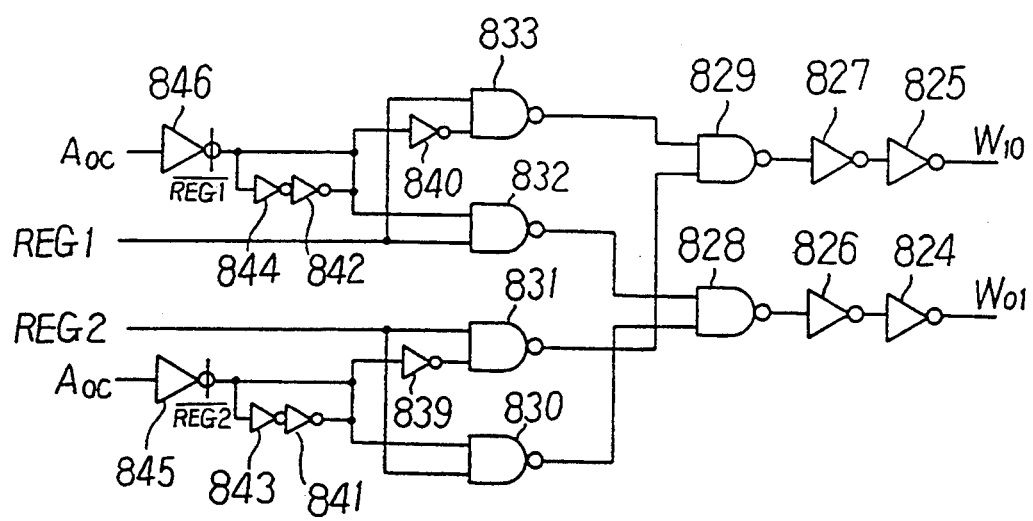
FIG. 15 is a circuit diagram showing a configuration of the circuit for generating control signals to the write data register in the circuit device shown in FIG. 14.

FIG. 15 shows a circuit configuration for generating the signals W01 and W10 applied to the write data register shown in FIG. 14. As shown, the address A0c is inputted to a clocked inverter 846 responsive to a clock signal /REG1. The output of the clocked inverter 846 is given to an inverter 840 and a NAND circuit 832 via a self-hold circuit composed of two series and feedback connected inverters 844 and 842. The output of the inverter 840 is inputted to a NAND circuit 833. Further, the signal REG1 is inputted to the NAND circuits 833 and 832.

On the other hand, the address A0c is inputted to a clocked inverter 845 responsive to a clock signal /REG2. The output of the clocked inverter 845 is given to an inverter 839 and a NAND circuit 830 via a self-hold circuit composed of two series and feedback connected inverters 843 and 841. The output of the inverter 839 is inputted to a NAND circuit 831. Further, the signal REG2 is inputted to the NAND circuits 831 and 830.

The respective outputs of the NAND circuits 833 and 831 are inputted to a NAND circuit 829. The respective outputs of the NAND circuits 832 and 830 are inputted to a NAND circuit 828. The output of the NAND circuit 829 is derived via two inverters 827 and 825 to obtain the signal W10. The output of the NAND circuit 828 is derived via two inverters 826 and 824 to obtain the signal W01. Here, the signal W10 corresponds to an address A0. Either one of the signal W10 or W01 is activated in accordance with the tap address A0, respectively.

In the circuit configuration as described above, when data are read from the core section 5 on the basis of the column select signals, it is possible to activate a plurality of the column select lines CSL0 to CSL7 connected to the same core section 5 simultaneously. Further, when a plurality of the column select lines CSL0 to CSL7 connected to the same core section 5 are activated simultaneously, it is possible to replace the column select lines CSC L0 to CS L7 with the spare column select lines SCSL ACEG and SCSL BDFH for each number less than the number of the column select lines CSL0 to CSL7 activated simultaneously. Further, it is also possible to select the column decoders other than the column decoders 31, 32 33, . . . selected by the input addresses. Further, it is also possible to operate the select signals cyclically when the column select lines CSL0 to CSL7 are selected. Further, the cyclic operation route can be controlled freely.

As the result of the above-mentioned operation, it is possible to realize the serial access and the wrap access required for the SDRAM in spite of a simple circuit configuration, and further to obtain a column system circuit high in production yield.

As described above, in the integrated circuit according to the present invention, since a plurality of the column select lines for accessing the columns of the core section can be activated simultaneously, and since the normal column select lines less in number than those activated simultaneously are replaced with the spare column select lines, the basic function of the SRAM can be realized simply; the column relief efficiency can be improved; and the production yield of the memory devices can be increased.

Reference signs in the claims are intended for better understanding of the claims, and shall not limit the scope of the claims.

TABLE 1

| | Column system activation sequence (Page wrap mode) | | | | |
|---|---|---|---|---|---|
| TAP | ADDR SEQ | CSL SEQ | DQ ACT SEQ | REG SCRAMBLE | |
| 0 | 01234567 | AB-AB-CD-CD EF-EF-GH-GH | 01-23-01-23 | 01-01--01-01 | 01 |
| 1 | 12345670 | AB-BC-CD-DE BF-FG-GH-HA | 12-30-12-30 | 10-10-10-10 | 10 |
| 2 | 23456701 | BC-BC-DE-DE FG-FG-HA-HA | 23-01-23-01 | 01--01-01-01 | 01 |
| 3 | 34567012 | BC-CD-DE-EF FG-GH-HA-AB | 30-12-30-12 | 10-10-10-10 | 10 |
| 4 | 45670123 | CD-CD-EF-EF GH-GH-AB-AB | 01-23-01-23 | 01-01-01-01 | 01 |
| 5 | 56701234 | CD-DE-FG-FG GH-HA-AB-BC | 12-30-12-30 | 10-10-10-10 | 10 |
| 6 | 67012345 | DE-DE-FG-FG HA-HA-BC-BC | 23-01-23-01 | 01-01-01-01 | 01 |
| 7 | 70123456 | DE-EF-FG-GH HA-AB-BC-CD | 30-12-30-12 | 10-10-10-10 | 10 |

UNDERLINE: addresses corresponding to the succeeding column decoder

TABLE 2

| | Column system activation sequence (8-wrap mode) | | | | |
|---|---|---|---|---|---|
| TAP | ADDR SEQ | CSL SEQ | DQ ACT SEQ | REG SCRAMBLE | |
| 0 | 01234567 | AB-AB-CD-CD EF-EF-GH-GH | 01-23-01-23 | 01-01--01-01 | 01 |
| 1 | 12345670 | AB-BC-CD-DA BF-FG-HE-HE | 12-30-12-30 | 10-10-10-10 | 10 |
| 2 | 23456701 | BC-BC-DA-DA FG-FG-HE-HE | 23-01-23-01 | 01--01-01-01 | 01 |
| 3 | 34567012 | BC-CD-DA-AB FG-GH-HE-EF | 30-12-30-12 | 10-10-10-10 | 10 |
| 4 | 45670123 | CD-CD-AB-AB GH-GH-EF-EF | 01-23-01-23 | 01-01-01-01 | 01 |
| 5 | 56701234 | CD-DA-AB-BC GH-HE-EF-FG | 12-30-12-30 | 10-10-10-10 | 10 |
| 6 | 67012345 | DA-DA-BC-BC HE-HE-FG-FG | 23-01-23-01 | 01-01-01-01 | 01 |
| 7 | 70123456 | DA-AB-BC-CD HE-EF-FG-GH | 30-12-30-12 | 10-10-10-10 | 10 |

TABLE 3

| | Column system activation sequence (8-interleave mode) | | | | |
|---|---|---|---|---|---|
| TAP | ADDR SEQ | CSL SEQ | DQ ACT SEQ | REG SCRAMBLE | |
| 0 | 01234567 | AB-AB-CD-CD EF-EF-GH-GH | 01-23-01-23 | 01-01-01-01 | 01 |
| 1 | 12345670 | AB-BC-CD-CD EF-EF-GH-GH | 10-32-10-32 | 10-10-10-10 | 10 |
| 2 | 23456701 | AB-AB-CD-CD EF-EF-GH-GH | 23-01-23-01 | 01--01-01-01 | 01 |
| 3 | 34567012 | AB-AB-CD-CD EF-EF-GH-GH | 32-10-32-10 | 10-10-10-10 | 10 |
| 4 | 45670123 | CD-CD-AB-AB GH-GH-EF-EF | 01-23-01-23 | 01-01-01-01 | 01 |
| 5 | 56701234 | CD-CD-AB-AB | 10-32-10-32 | 10-10-10-10 | 10 |

TABLE 3-continued

Column system activation sequence (8-interleave mode)

| TAP | ADDR SEQ | CSL SEQ | DQ ACT SEQ | REG SCRAMBLE |
|---|---|---|---|---|
| 6 | 67012345 | GH-GH-EF-EF<br>CD-CD-AB-AB | 23-01-23-01 | 01-01-01-01 | 01 |
| 7 | 70123456 | GH-GH-EF-EF<br>CD-CD-AB-AB<br>GH-GH-EF-EF | 32-10-32-10 | 10-10-10-10 | 10 |

TABLE 4

Column system activation sequence (4-wrap mode)

| TAP | ADDR SEQ | CSL SEQ | DQ ACT SEQ | REG SCRAMBLE |
|---|---|---|---|---|
| 0 | 0 1 2 3 | AB-AB/CD-CD<br>EF-EF/GH-GH | 01 - 23 | 01 - 01 | 01 |
| 1 | 1 2 3 0 | AB-AB/CD-CD<br>EF-EF/GH-GH | 12 - 30 | 10 - 10 | 10 |
| 2 | 2 3 0 1 | AB-AB/CD-CD<br>EF-EF/GH-GH | 23 - 01 | 01 - 01 | 01 |
| 3 | 3 0 1 2 | AB-AB/CD-CD<br>EF-EF/GH-GH | 32 - 12 | 10 - 10 | 10 |

TABLE 5

Column system activation sequence (4-interleave mode)

| TAP | ADDR SEQ | CSL SEQ | DQ ACT SEQ | REG SCRAMBLE |
|---|---|---|---|---|
| 0 | 0 1 2 3 | AB-AB/CD-CD<br>EF-EF/GH-GH | 01 - 23 | 01 - 01 | 01 |
| 1 | 1 0 2 3 | AB-AB/CD-CD<br>EF-EF/GH-GH | 10 - 32 | 10 - 10 | 10 |
| 2 | 2 3 0 1 | AB-AB/CD-CD<br>EF-EF/GH-GH | 23 - 01 | 01 - 01 | 01 |
| 3 | 3 2 1 0 | AB-AB/CD-CD<br>EF-EF/GH-GH | 32 - 10 | 10 - 10 | 10 |

TABLE 6

(Column select description in page mode)

| TAP | KIND | HEAD | SIGNAL |
|---|---|---|---|
| 0 | A | AB / FF | T1 |
| 1 | A | AB / EF | SERI |
| 2 | A | BC / FG | T2 |
| 3 | S | BC / FG | SERI |
| 4 | A | CD / GH | T1 |
| 5 | S | CD / GH | SERI |
| 6 | A | DE / HA | T2 |
| 7 | S | DE / HA | SERI |

TABLE 7

(Column select description in 8-wrap mode)

| TAP | KIND | HEAD | SIGNAL |
|---|---|---|---|
| 0 | A | AB / FF | T1 |
| 1 | A | AB / EF | SERI |
| 2 | A | BC / FG | T2 |
| 3 | S | BC / FG | SERI |
| 4 | A | CD / GH | T1 |
| 5 | S | CD / GH | SERI |
| 6 | A | DE / HA | T2 |
| 7 | S | DE / HA | SERI |

TABLE 8

(Column select description in 8-interleave mode)

| TAP | KIND | HEAD | SIGNAL |
|---|---|---|---|
| 0 | A | AB / FF | T1 |
| 1 | A | AB / EF | T1 |
| 2 | A | AB / EF | T1 |
| 3 | A | AB / EF | T1 |
| 4 | A | CD / GH | T1 |
| 5 | A | CD / GH | T1 |
| 6 | A | CD / GH | T1 |

TABLE 8-continued (Column select description in 8-interleave mode)

| TAP | KIND | HEAD | SIGNAL |
|---|---|---|---|
| 7 | A | CD / GH | T1 |

TABLE 9

(Column select description in 4-wrap mode)

| TAP | KIND | HEAD | SIGNAL |
|---|---|---|---|
| 0 | A | AB / CD / EF / GH | T1 |
| 1 | A | AB / CD / EF / GH | T1 |
| 2 | A | AB / CD / EF / GH | T1 |
| 3 | A | AB / CD / EF / GH | T1 |

TABLE 10

(Column select description in 4-interleave mode)

| TAP | KIND | HEAD | SIGNAL |
|---|---|---|---|
| 0 | A | AB / CD / EF / GH | T1 |
| 1 | A | AB / CD / EF / GH | T1 |
| 2 | A | AB / CD / EF / GH | T1 |
| 3 | A | AB / CD / EF / GH | T1 |

TABLE 11

(Description of data activation sequence)

| | ADD | $A_2$ | $A_1$ | $A_0$ | DQ ACT SEQ | | TYPE |
|---|---|---|---|---|---|---|---|
| 8- | 0 | | 0 | 0 | 01-23-01-23 | 01-23 | ALFA. R1 |
| PAGE | 1 | 0 | 0 | 1 | 12-30-12-30 | 12-03 | BETA. R1 |
| WRAP | 2 | | 1 | 0 | 23-01-23-01 | 23-01 | ALFA. R2 |
| | 3 | | 1 | 1 | 30-12-30-12 | 03-12 | BETA. R2 |
| | 4 | | 0 | 0 | 01-23-01-23 | 01-23 | ALFA. R1 |
| | 5 | 1 | 0 | 1 | 12-30-12-30 | 12-03 | BETA. R1 |
| | 6 | | 1 | 0 | 23-01-23-01 | 23-01 | ALFA. R2 |
| | 7 | | 1 | 1 | 30-12-30-12 | 03-12 | BETA. R2 |
| 8- | 0 | | 0 | 0 | 01-23-01-23 | 01-23 | ALFA. R1 |

TABLE 11-continued (Description of data activation sequence)

| | ADD | $A_2$ | $A_1$ | $A_0$ | DQ ACT SEQ | | TYPE | |
|---|---|---|---|---|---|---|---|---|
| INTL | 1 | 0 | | 1 | 10-32-10-32 | 01-23 | ALFA. R1 | |
| | 2 | | 1 | 0 | 23-01-23-01 | 23-01 | ALFA. R2 | |
| | 3 | | | 1 | 32-10-32-10 | 23-01 | ALFA. R2 | |
| | 4 | | 0 | 0 | 01-23-01-23 | 01-23 | ALFA. R1 | |
| | 5 | 1 | | 1 | 10-32-10-32 | 01-23 | ALFA. R1 | |
| | 6 | | | 0 | 23-01-23-01 | 23-01 | ALFA. R2 | |
| | 7 | | 1 | 1 | 32-10-32-10 | 23-01 | ALFA. R2 | |
| 4-WRAP | 0 | 0 | 0 | 0 | 01-23 | 01-23 | ALFA. R1 | |
| | 1 | | | 1 | 12-30 | 12-03 | BETA. R1 | |
| | 2 | | 1 | 0 | 23-01 | 23-01 | ALFA. R2 | |
| | 3 | | | 1 | 30-12 | 03-12 | BETA. R2 | |
| 4-INTL | 0 | 0 | 0 | 0 | 01-23 | 01-23 | ALFA. R1 | |
| | 1 | | | 1 | 10-32 | 01-23 | ALFA. R1 | |
| | 2 | | 1 | 0 | 23-01 | 23-01 | ALFA. R2 | |
| | 3 | | | 1 | 32-10 | 23-01 | ALFA. R2 | |

TABLE 12

(Description of signals in FIG. 8)

| ALFA | INTERLEAVE, WRAP /$A_0$ |
|---|---|
| BETA | WRAP $A_0$ |

TABLE 13

(Description of signals in FIG. 8)

| R1 | $A_1 = 0$ |
|---|---|
| R2 | $A_1 = 1$ |

What is claimed is:

1. An integrated circuit device, comprising:
a memory cell array composed of a plurality of memory cells each for storing data respectively and provided with a normal column portion used under normal conditions, data being transmitted and received between the memory cells and corresponding column lines;
a core section having a plurality of data lines, each of the column lines being connected to any of the data lines through a switch, data being transmitted and received between the data line and the column line through the switch;
a decoder section connected to the switch of said core section through a plurality of column select lines, any given number of the column select lines being activated simultaneously in response to column select drive signals, each activated column select line energizing the switch to connect an associated column line and an associated data line, said decoder section including a plurality of column decoders selected by partial decoders which are operative in response to partial decode signals, the selected decoders decoding the column select drive signals to activate any given number of the column select lines simultaneously;
input and output means for inputting data to and outputting data from the data lines;
wherein when a page signal is inputted to the partial decoders, the partial decoders can select a column decoder other than a column decoder which would be selected based on the partial decode signals;
wherein the column select drive signals are applied to said column decoder's as cyclic operation signals to select any given number of the column select lines in a cyclic fashion such that some of the column select lines are repeatedly selected in a predetermined sequence; and
wherein a cyclic operation mode of the column select drive signals can be controlled on the basis of change signals to change at least one of the number of and the sequence of the column select lines to be selected.

2. The integrated circuit device of claim 1, wherein said output means transmits and receives data to and from the data lines in accordance with a predetermined sequence.

3. The integrated circuit device of claim 2, wherein said output means includes:
a data buffer connected to the data lines; and
a data register having registers for inputting and outputting data, both said data buffer and said data register being so constructed as to transmit and receive data in a predetermined sequence.

4. The integrated circuit device of claim 3, wherein said data register further comprises scramblers operative in response to tap addresses for transmitting and receiving data to and from said data buffer in a predetermined sequence.

5. The integrated circuit device of claim 4, wherein data are transmitted and received between buffer sections of said data buffer and the registers, the buffer sections being activated on the basis of data buffer activation signals.

6. An integrated circuit device, comprising:
a memory cell array composed of a plurality of memory cells each for storing data respectively and provided with a normal column portion used under normal conditions, data being transmitted and received between the memory cells and corresponding column lines;
a core section having a plurality of data lines, each of the column lines being connected to any of the data lines through a switch, data being transmitted and received between the connected data line and the column line through the switch;
a decoder section connected to the switch of said core section through a plurality of column select lines, any given number of the column select lines being activated simultaneously in response to column select drive signals, each activated column select line energizing the switch to connect an associated column line and an associated data line, said decoder section including a plurality of column decoders selected by partial decoders which are operative in response to partial decode signals, the selected decoders decoding the column select drive signals to activate any given number of the column select lines simultaneously;
input and output means for inputting data to and outputting data from the data lines;
wherein said memory cell array includes a spare column portion connected to spare column lines to read data from the memory cells of the spare column portion, the spare column lines being connected to the data lines through another switch energized by spare column select lines;
wherein when a spare/normal discrimination result is spare, the column select lines whose number is less than the number of the column select lines activated by said decoder section under normal conditions are replaced with the spare column select lines;
wherein when a page signal is inputted to the partial decoders, the partial decoders can select a column decoder other than the column decoder which would be selected based on the partial decode signals;

wherein the column select drive signals are applied to said column decoders as cyclic operation signals to select any given number of the column select lines in a cyclic fashion such that some of the column select lines are repeatedly selected in a predetermined sequence; and wherein a cyclic operation mode of the column select drive signals can be controlled on the basis of change signals to change at least one of the number of and the sequence of the column select lines to be selected.

7. The integrated circuit device of claim 6, wherein said output means transmits and receives data to and from the data lines in accordance with a predetermined sequence.

8. The integrated circuit device of claim 7, wherein said output means includes:
a data buffer connected to the data lines; and
a data register having registers for inputting and outputting data, both said data buffer and said data register being so constructed as to transmit and receive data in a predetermined sequence.

9. The integrated circuit device of claim 8, wherein said data register further comprises scramblers operative in response to tap addresses, for transmitting and receiving data to and from said data buffer in a predetermined sequence.

10. The integrated circuit device of claim 9, wherein data are transmitted and received between buffer sections of said data buffer and the registers, the buffer sections being activated on the basis of data buffer activation signals.

11. A method of activating column select lines in an integrated circuit device, comprising the steps of:
operating partial decoders on the basis of partial decode signals to select any given column decoders;
decoding column select drive signals by the selected column decoders to select any given number of column select lines;
turning on switches for connecting and disconnecting column lines of a memory cell array to and from data lines, the data lines being connected to input and output means by the selected column select lines;
wherein the column select drive signals are applied to the column decoders as cyclic operation signals to select any given number of the column select lines in a cyclic fashion such that some of the column select lines are repeatedly selected in a predetermined sequence, and
wherein the number of and the sequence of the column select lines to be selected are changed by changing a cyclic operation mode of the column select drive signals on the basis of change signals.

12. A method of activating column select lines in an integrated circuit device, comprising the steps of:
operating partial decoders on the basis of partial decode signals to select any given column decoders;
decoding column select drive signals by the selected column decoders to select any given number of column select lines;
turning on switches for connecting and disconnecting column lines of a memory cell array to and from data lines, the data lines being connected to input and output means by the respective selected column select lines;

wherein when a spare/normal discrimination result is spare, the column select lines whose number is more than the number of the column select lines replaced with spare column select lines are selected;

wherein the column select drive signals are applied to the column decoders as cyclic operation signals to select any given number of the column select lines in a cyclic fashion such that some of the column select lines are repeatedly selected in a predetermined sequence, and wherein the number of and the sequence of the column select lines to be selected are changed by changing a cyclic operation mode of the column select drive signals on the basis of change signals.

13. An integrated circuit device, comprising:
a memory cell array composed of a plurality of memory cells each for storing data which is transmitted and received between each memory cell and a corresponding column line;
a plurality of partial decoders, one of said partial decoders being selected on the basis of partial decode signals, said selected partial decoder being connected to another partial decoder adjacent thereto through a sequential signal line; and
a plurality of decoders each provided for a corresponding partial decoder, each of said decoders being selected by its corresponding partial decoder being set to select status, each of said selected decoders decoding a plurality of column select drive signals to select a predetermined number of the column lines.

14. The integrated circuit device of claim 13, wherein each of the column select drive signals is a select signal when at a low level and a non-select signal when at a high level.

15. The integrated circuit device of claim 13, wherein when a page signal is inputted, one of said partial decoders is selected on the basis of a decoded result of the partial decode signals and the selected partial decoder further selects another adjacent partial decoder connected thereto through the sequential signal line.

16. The integrated circuit device of claim 15, wherein each of said partial decoders selects its corresponding column decoder in accordance with a logical OR result of a first AND logic and a second AND logic, the first AND logic being an AND logical result of the partial decode signals and the second AND logic being an AND logical result of the page signal and the first AND logic of a front-stage partial decoder.

17. The integrated circuit device of claim 13, wherein each of said decoders selects the two column-select lines simultaneously.

18. The integrated circuit device of claim 17, wherein when each of said decoders selects the two column select lines simultaneously, four column lines are thereby selected simultaneously.

19. The integrated circuit device of claim 13, further comprising a plurality of data lines each for transmitting and receiving data with a corresponding column line, each data line and each corresponding column line being connected via a corresponding switching means, each of said decoders selecting column select lines as output lines on the basis of decoded results of the column select drive signals, the selected column select lines energizing the corresponding switching means.

20. The integrated circuit device of claim 19, wherein said data lines are arranged for 4 bits.

21. The integrated circuit device of claim 19, wherein said data lines are connected to a data input/output terminal via scramble circuits in such a way that the data lines can be connected to the data input/output terminal in any required sequence.

22. The integrated circuit device of claim 19, wherein a bit number of the column select drive signal is smaller than that of said data lines.

23. The integrated circuit device of claim 19, wherein a bit number of the column select drive signal is 8, and a bit number of the data lines is 4.

24. The integrated circuit device of claim 19, wherein each of said column select lines is branched into two branched column select lines, and each branched column select line energizes and deenergizes each of said switching means.

25. The integrated circuit device of claim 19, wherein each of said column decoders transmits a logical result of the output of the corresponding partial decoder and each of the column select drive signals to each of said column select lines via at least two inverters.

26. The integrated circuit device of claim 19, wherein each of the column select drive signals is a select signal when at a low level and a non-select signal when at a high level.

27. The integrated circuit device of claim 19, wherein when a page signal is inputted, one of said partial decoders is selected on the basis of a decoded result of the partial decode signals and the selected partial decoder further selects another adjacent partial decoder connected thereto through the sequential signal line.

28. The integrated circuit device of claim 27, wherein each of said partial decoders selects its corresponding column decoder in accordance with a logical OR result of a first AND logic and a second AND, logic, the first AND logic being an AND logical result of the partial decoder signals and the second AND logic being an AND logical result of the page signal and the first AND logic of a front-stage partial decoder.

29. The integrated circuit device of claim 19, wherein each of said decoders selects the two column select lines simultaneously.

30. The integrated circuit device of claim 29, wherein when each of said decoders selects the two column select lines simultaneously, four column lines are thereby selected simultaneously.

31. An integrated circuit device, comprising:
a memory cell array composed of a plurality of memory cells each for storing data which is transmitted and received between each memory cell and a corresponding column line;
a plurality of partial decoders, one of said partial decoders being selected on the basis of partial decode signals, said selected partial decoder being connected to another partial decoder adjacent thereto through a sequential signal line; and
a plurality of decoders each provided for a corresponding partial decoder, each of said decoders being selected by its corresponding partial decoder when its corresponding partial decoder is set to select status, each of said selected decoders decoding a plurality of column select drive signals to select a predetermined number of the column lines;
one of said partial decoders being selected on the basis of a decoded result of the partial decode signals, and the selected partial decoder further selecting another adjacent partial decoder connected thereto through the sequential signal line.

32. The integrated circuit device of claim 31, wherein each of said partial decoders selects its corresponding column decoder in accordance with a logical OR result of a first AND logic and a second AND logic, the first AND logic being an AND logical result of the partial decoder signals and the second AND logic being an AND logical result of the page signal and the first AND logic of a front-stage partial decoder.

33. The integrated circuit device of claim 31, further comprising a plurality of data lines each for transmitting and receiving data with a corresponding column line, each data line and each corresponding column line being connected via switching means, each of said decoders selecting column select lines as output lines on the basis of decoded results of the column select drive signals, the selected column select lines energizing the corresponding switching means.

34. The integrated circuit device of claim 33, wherein said data, lines are arranged for 4 bits.

35. The integrated circuit device of claim 33, wherein said data lines are connected to a data input/output terminal via scramble circuits in such a way that the data lines can be connected to the data input/output terminal in any required sequence.

36. The integrated circuit device of claim 33, wherein a bit number of the column select drive signal is smaller than that of said data lines.

37. The integrated circuit device of claim 33, wherein a bit number of the column select drive signal is 8, and a bit number of the data lines is 4.

38. The integrated circuit device of claim 33, wherein each of said column select lines is branched into two branched column select lines and each branched column select line energizes and deenergizes said switching means.

39. The integrated circuit device of claim 33, wherein each of said column decoders transmits a logical result of the output of the corresponding partial decoder and each of the column select drive signals to each of said column select lines via at least two inverters.

40. The integrated circuit device of claim 33, wherein each of the Column select drive signals is a select signal when at a low level and a non-select signal when at a high level.

41. The integrated circuit device of claim 33, wherein each of said decoders selects the two column select lines simultaneously.

42. The integrated circuit device of claim 41, wherein when each of said decoders selects the two column select lines simultaneously, four column lines are thereby selected simultaneously.

* * * * *